(12) United States Patent
Patra et al.

(10) Patent No.: US 12,259,430 B1
(45) Date of Patent: Mar. 25, 2025

(54) TECHNOLOGIES FOR ON-CIRCUIT BOARD DE-EMBEDDING

(71) Applicant: Intel Corporation, Santa Clara, CA (US)

(72) Inventors: Bishnu Prasad Patra, Zoetermeer (NL); Stefano Pellerano, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 17/871,414

(22) Filed: Jul. 22, 2022

(51) Int. Cl.
*G01R 31/28* (2006.01)
*H05K 1/02* (2006.01)
*H01L 23/00* (2006.01)

(52) U.S. Cl.
CPC ....... *G01R 31/2884* (2013.01); *H05K 1/0268* (2013.01); *H05K 1/029* (2013.01); *H01L 24/16* (2013.01); *H01L 24/48* (2013.01); *H01L 24/49* (2013.01); *H01L 2224/16227* (2013.01); *H01L 2224/48227* (2013.01); *H01L 2224/49176* (2013.01); *H05K 2201/10053* (2013.01)

(58) Field of Classification Search
CPC .. G01R 31/2884; H05K 1/0268; H05K 1/029; H05K 2201/10053; H01L 24/16; H01L 24/48; H01L 24/49; H01L 2224/16227; H01L 2224/48227; H01L 2224/49176
USPC ..................... 324/750.3, 537, 500
See application file for complete search history.

(56) References Cited

U.S. PATENT DOCUMENTS

| | | | |
|---|---|---|---|
| 8,233,974 B2 * | 7/2012 | Ward | A61B 5/0537 |
| | | | 600/547 |
| 10,236,240 B2 * | 3/2019 | Chou | H01L 23/49838 |
| 11,573,260 B2 * | 2/2023 | Ayres | G01R 31/54 |
| 2018/0284186 A1 * | 10/2018 | Chadha | H01L 24/13 |
| 2020/0303292 A1 * | 9/2020 | Kraft | H01L 24/49 |
| 2020/0365559 A1 * | 11/2020 | Hwang | H01L 23/3121 |

OTHER PUBLICATIONS

Ranzani, Leonardo, et al. "Two-Port Microwave Calibration at Millikelvin Temperatures." Review of Scientific Instruments, vol. 84, No. 3, Mar. 2013, p. 034704. aip.scitation.org (Atypon), https://doi.org/10.1063/1.4794910, 10 pages.

Simbierowicz, Slawomir, et al. "Microwave Calibration of Qubit Drive Line Components at Millikelvin Temperatures." Applied Physics Letters, vol. 120, No. 5, Jan. 2022, p. 054004. aip.scitation.org (Atypon), https://doi.org/10.1063/5.0081861, 7 pages.

(Continued)

*Primary Examiner* — Giovanni Astacio-Oquendo
(74) *Attorney, Agent, or Firm* — Alliance IP, LLC

(57) ABSTRACT

Technologies for on-circuit board de-embedding are disclosed. In the illustrative embodiment, several micromechanical relays on a circuit board can connect a trace on the circuit board to an open circuit, a closed circuit, a load circuit, or a through circuit. For the through circuit, the trace is connected to an integrated circuit component mounted on the circuit board. A cable is connected to the trace, allowing for signals to be sent to any of the four circuits without any probes connected to the circuit board. The transmitted and/or reflected signals can be measured, which can be used to de-embed the integrated circuit component.

25 Claims, 16 Drawing Sheets

(56) References Cited

OTHER PUBLICATIONS

Wang, Haozhi, et al. "Cryogenic Single-Port Calibration for Superconducting Microwave Resonator Measurements." Quantum Science and Technology, vol. 6, No. 3, Jul. 2021, p. 035015. DOI.org (Crossref), https://doi.org/10.1088/2058-9565/ac070e, 22 pages.

* cited by examiner

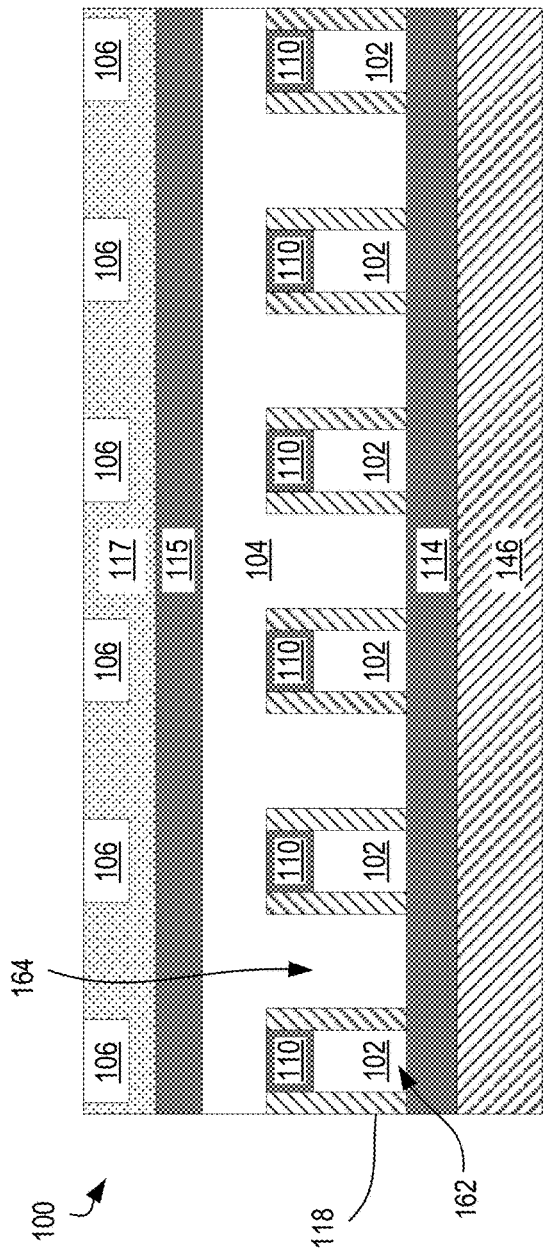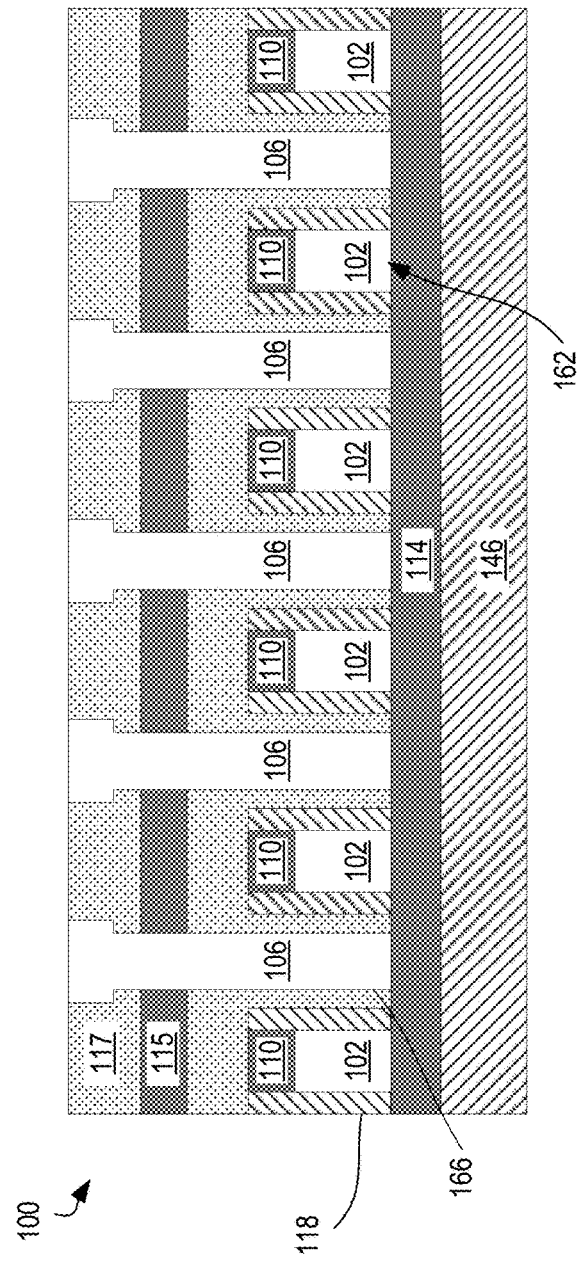

TECHNOLOGIES FOR ON-CIRCUIT BOARD DE-EMBEDDING

BACKGROUND

The accurate characterization of an integrated circuit device requires de-embedding the test fixture needed to connect the device under test (DUT) to the measurement equipment. On-chip wafer probing is typically used with various calibration standards for de-embedding the test fixture. However, on-chip probing cannot be used to characterize devices operating in an enclosed environment, where the device cannot be accessed with probes.

BRIEF DESCRIPTION OF THE DRAWINGS

FIGS. 1A-1F illustrate various views of an example quantum compute device, in accordance with one embodiment.

DETAILED DESCRIPTION

Figure 1A:
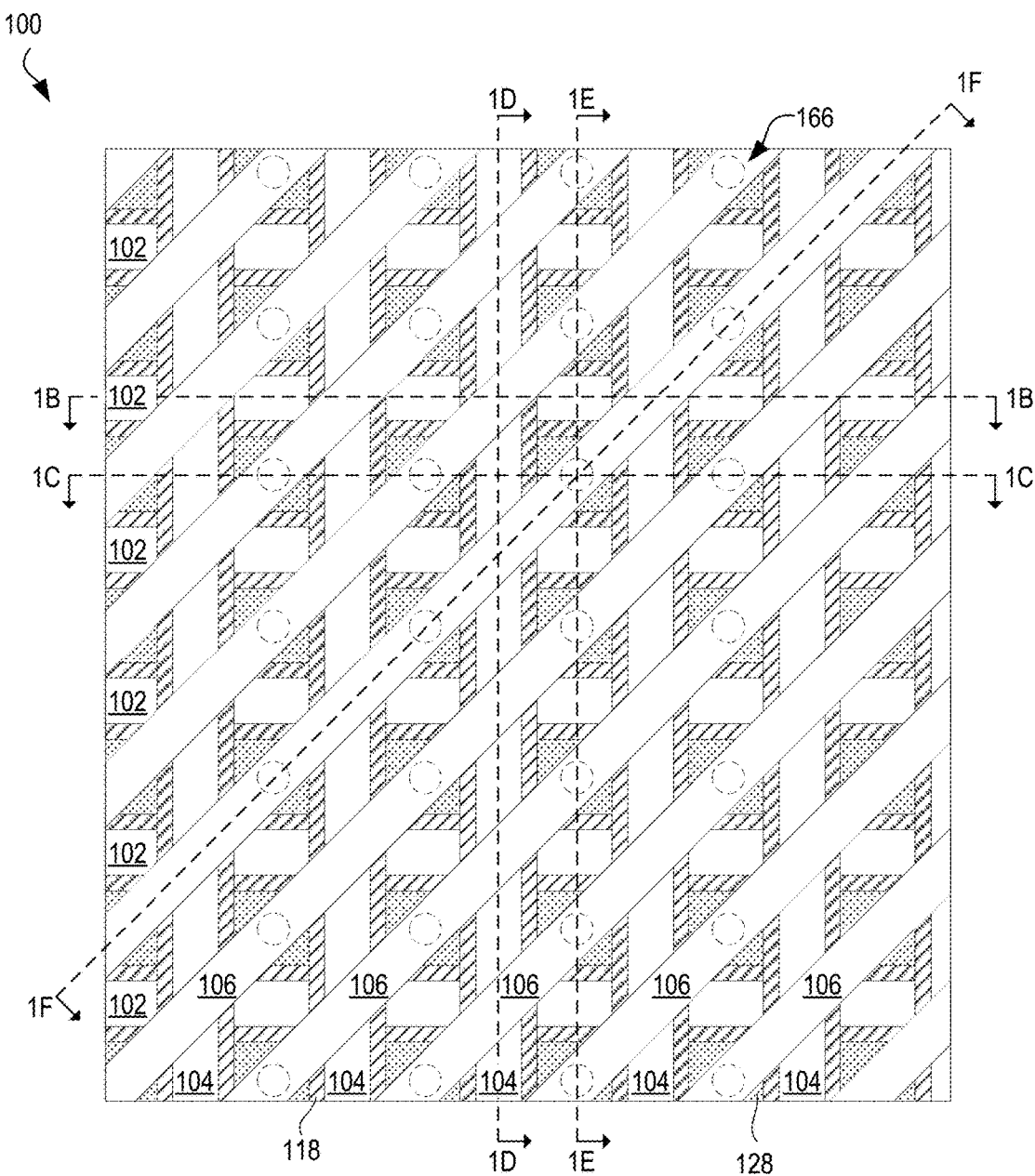

Aspects of the present disclosure may include a circuit board for de-embedding of integrated circuit devices. In the illustrative embodiment, the circuit board and an integrated circuit device that acts as a device under test (DUT) are inside a dilution refrigerator at low temperature, such as less than 100 millikelvin. The circuit board includes one or more switches that can be actuated to switch a trace connected to a cable between a short circuit, an open circuit, a load circuit, and through circuit. Transmission and/or reflection parameters can be measured in each configuration, allowing for the DUT to be de-embedded, removing the effect of any fixtures and traces before a reference plane. Such an approach can place the reference plane after the traces, switches, and other components on the circuit board, increasing the measurement accuracy. Such an approach avoids the limits on measurement accuracy when characterizing the impedance and quality factor of devices caused by the traces and routing on the circuit board. Such effects can be substantial for high quality factor and nanoscale devices such as superconducting microwave resonators, cryogenic amplifiers, single-electron transistors, and quantum dots.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

References are made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

A quantum computer uses quantum-mechanical phenomena such as superposition and entanglement to perform computations, simulations, or other functions. In contrast to digital computers, which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin." Qubits in quantum mechanical systems can be in a superposition of both states at the same time, a trait that is unique and fundamental to quantum computing.

Quantum computing systems execute algorithms containing quantum logic operations performed on qubits. In some cases, the result of the algorithm is not deterministic. The quantum algorithm may be repeated many times in order to determine a statistical distribution of results or in order to have a high likelihood of finding the correct answer. In some cases, a classical algorithm may be used to check if the quantum computer determined the correct result.

Qubits have been implemented using a variety of different technologies which are capable of manipulating and reading quantum states. These include but are not limited to quantum dot devices (spin-based and spatial-based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer, including, but not limited to, those listed above. The particular physical implementation used for qubits is not necessarily required for the embodiments of the invention described herein.

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
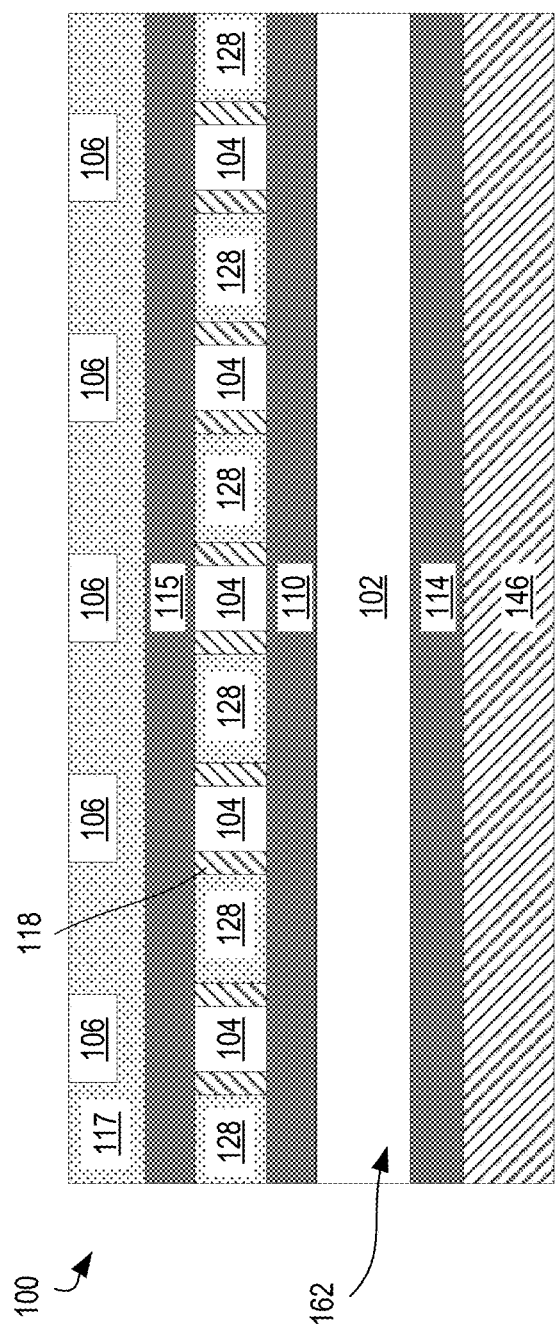
Figure 1C:
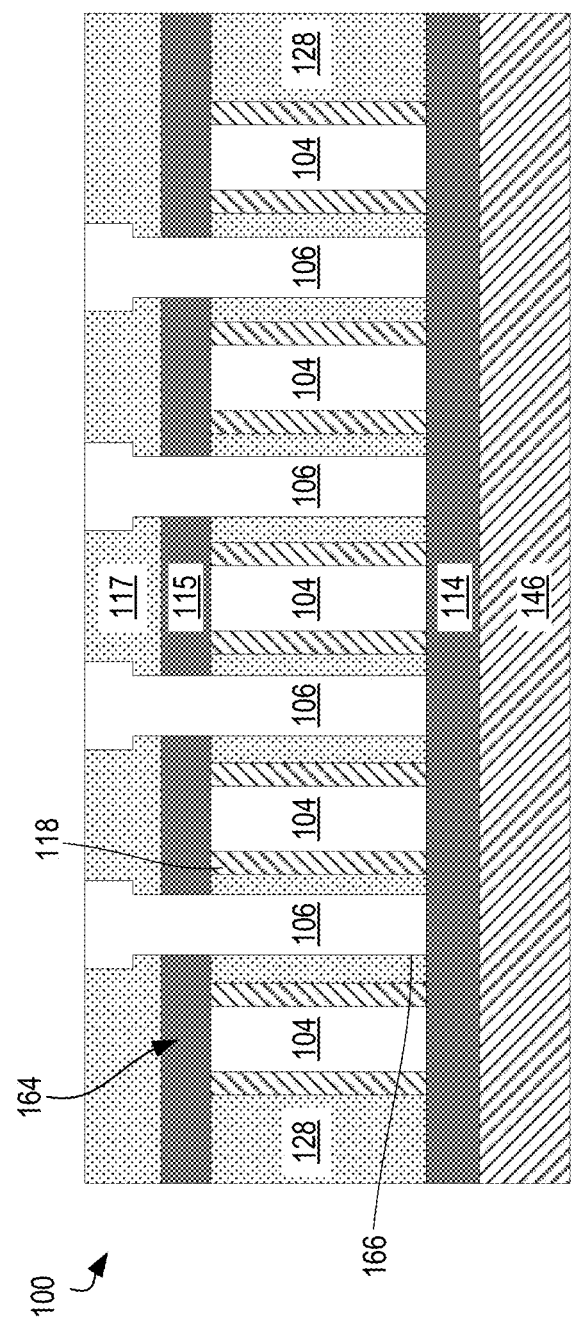
Figure 1F:
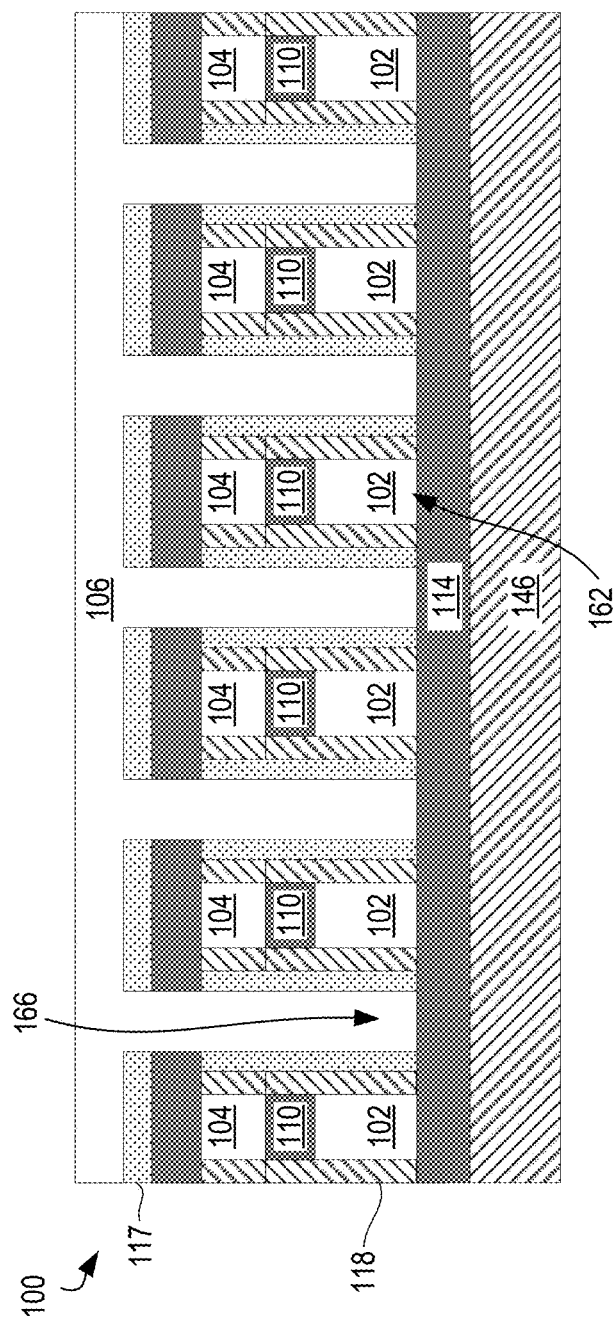

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Figure 2:
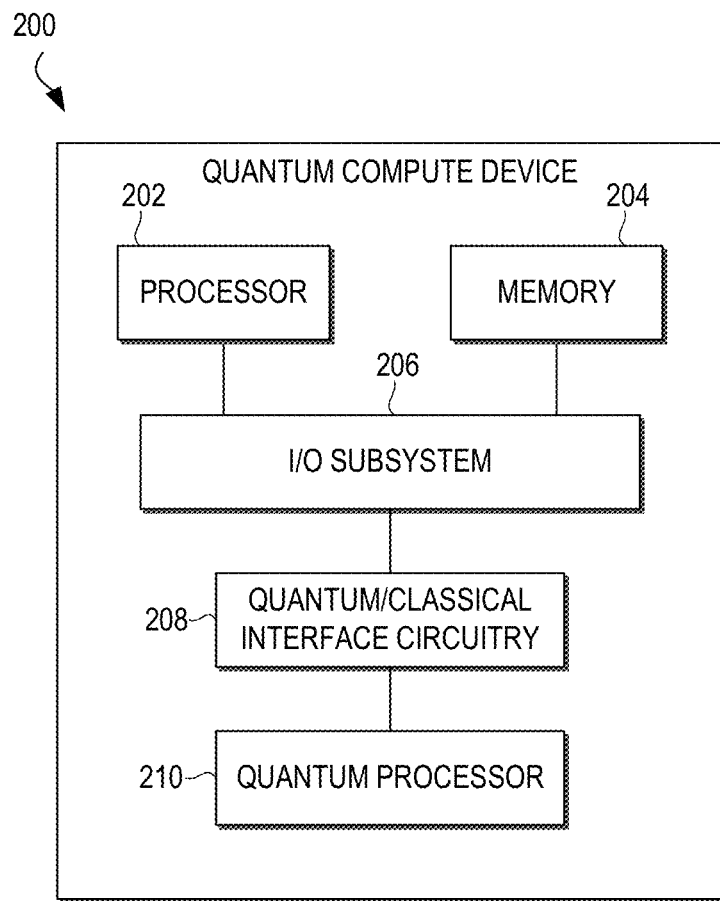
FIG. 2 is a simplified block diagram of at least one embodiment of a quantum compute device.

Referring now to FIG. 2, a simplified block diagram of a quantum compute device 200 is shown. In some embodiments, the quantum compute device 200 may include the quantum dot devices 100 described above in regard to FIGS. 1A-1F. The quantum compute device 200 may be embodied as or included in any type of compute device. For example, the quantum compute device 200 may include or otherwise be included in, without limitation, a server computer, an embedded computing system, a System-on-a-Chip (SoC), a multiprocessor system, a processor-based system, a consumer electronic device, a desktop computer, a laptop computer, a network device, a networked computer, a distributed computing system, and/or any other computing device. The illustrative quantum compute device 200 includes a processor 202, a memory 204, an input/output (I/O) subsystem 206, a quantum/classical interface circuitry 208, and a quantum processor 210. In some embodiments, one or more of the illustrative components of the quantum compute device 200 may be incorporated in, or otherwise form a portion of, another component. For example, the memory 204, or portions thereof, may be incorporated in the processor 202 in some embodiments. In some embodiments, the quantum compute device 200 may be embodied as the electrical device 1400 described below in regard to FIG. 14 or may include any suitable component of the electrical device 1400.

In some embodiments, the quantum compute device 200 may be located in a data center with other compute devices, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves), a micro data center, etc. In some embodiments, the quantum compute device 200 may receive jobs over a network (such as the Internet) to perform on the quantum processor 210. The quantum compute device 200 may perform the jobs on the quantum processor 210 and send the results back to the requesting device.

The processor 202 may be embodied as any type of processor capable of performing the functions described herein. For example, the processor 202 may be embodied as a single or multi-core processor(s), a single or multi-socket processor, a digital signal processor, a graphics processor, a neural network compute engine, an image processor, a microcontroller, or other processor or processing/controlling circuit. The processor 202 may include multiple processor cores. In some embodiments, the processor 202 supports quantum extensions to an existing ISA of the processor/core 202, allowing instructions that interface with the quantum/classical interface circuitry 208 and the quantum processor 210.

The memory 204 may be embodied as any type of volatile or non-volatile memory or data storage capable of performing the functions described herein. In operation, the memory 204 may store various data and software used during operation of the quantum compute device 200, such as operating systems, applications, programs, libraries, and drivers. The memory 204 is communicatively coupled to the processor 202 via the I/O subsystem 206, which may be embodied as circuitry and/or components to facilitate input/output operations with the processor 202, the memory 204, and other components of the quantum compute device 200. For example, the I/O subsystem 206 may be embodied as, or otherwise include, memory controller hubs, input/output control hubs, firmware devices, communication links (e.g., point-to-point links, bus links, wires, cables, light guides, printed circuit board traces, etc.) and/or other components and subsystems to facilitate the input/output operations. The I/O subsystem 206 may connect various internal and external components of the quantum compute device 200 to each other with use of any suitable connector, interconnect, bus, protocol, etc., such as an SoC fabric, PCIe®, USB2, USB3, USB4, NVMe®, Thunderbolt®, Compute Express Link (CXL), and/or the like. In some embodiments, the I/O subsystem 206 may form a portion of a system-on-a-chip (SoC) and be incorporated, along with the processor 202 and the memory 204 and other components of the quantum compute device 200 on a single integrated circuit chip.

The quantum/classical interface circuitry 208 is configured to interface with both classical components of the quantum compute device 200, such as the processor 202 and memory 204, as well as the quantum processor 210. The quantum/classical interface circuitry 208 may include a variety of analog or digital circuitry, such as analog-to-digital converters, digital-to-analog converters, high gain amplifiers, low noise amplifiers, cryogenic amplifiers, field-programmable gate arrays (FPGAs), classical processors, application-specific integrated circuits (ASICs), signal conditioning circuitry, etc. In some embodiments, some or all of the quantum/classical interface circuitry 208 may be inside of a refrigerator, such as a dilution refrigerator, a magnetic refrigerator, a helium-4 and/or helium-3 refrigerator, etc. Some or all of the components of the quantum/classical interface circuitry 208 may be at any suitable temperature, such as 10 millikelvin, 100 millikelvin, 4 Kelvin, 20 Kelvin, 77 Kelvin, room temperature or above, or anywhere in between.

The quantum processor 210 is configured to operate one or more qubits. The quantum processor 210 may include a quantum processor die, companion chip, and/or other suitable components of the device 200. The qubits may be any suitable type of qubit, such as a quantum dot spin qubit described above in regard to FIGS. 1A-1F. In other embodiments, the qubits may be, e.g., charge qubits, transmon qubits, microwave qubits, superconducting qubits, or any other suitable type of qubits. The quantum processor 210 may include any suitable number of physical or logical qubits, such as $1\text{-}10^6$. In the illustrative embodiment, some or all of the quantum processor 210 is in a refrigerator such as a dilution refrigerator. In particular, in the illustrative embodiment, the qubits are held at a temperature of about 20 millikelvin. In other embodiments, the qubits may be held at any suitable temperature, such as 1-100 millikelvin or higher, depending on the temperature sensitivity of the particular qubit in use.

The quantum processor 210 may be able to control the various qubits in various ways, such as by performing two-qubit gates, three-qubit gates, error correction operations, transferring a state from one type of qubit to another, measuring some, any, or all of the qubits, initializing some, any, or all of the qubits, etc.

The quantum compute device 200 may include additional components not shown in FIG. 2, such as one or more data storage devices, a network interface controller, one or more peripheral devices, etc.

Figure 3:
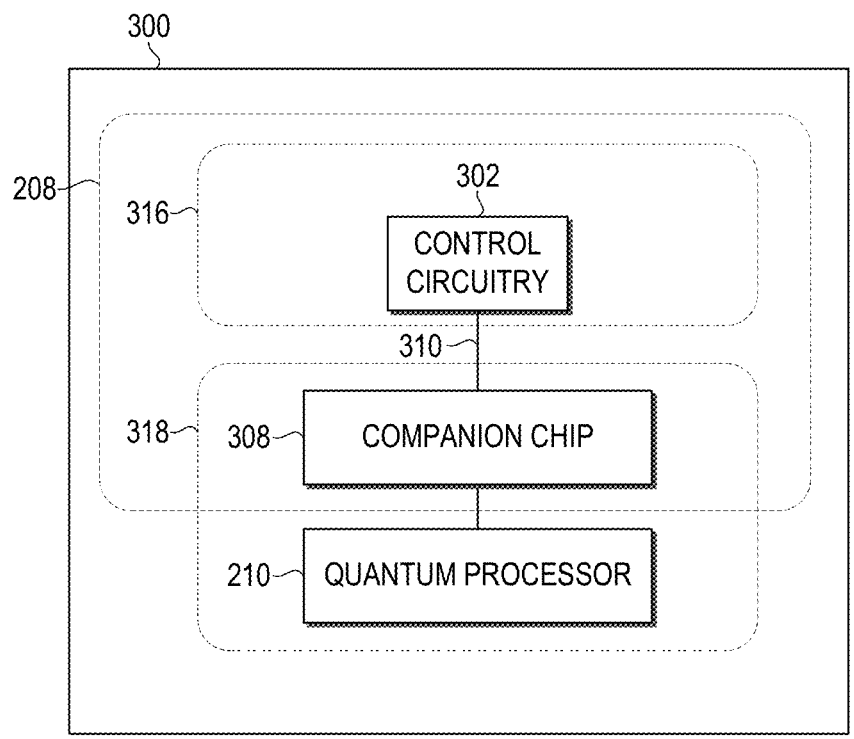
FIG. 3 is a simplified block diagram of at least one embodiment of a portion of the quantum compute device of FIG. 2.

Referring now to FIG. 3, in one embodiment, the quantum processor 210 and some or all of the quantum/classical interface circuitry 208 may be in a cryogenic refrigerator 300. The quantum/classical interface circuitry 208 includes control circuitry 302 that can interface with a companion chip 308. The control circuitry 302 may be connected to the companion chip 308 by one or more wires 310. The wires 310 may be embodied as one or more cables, buses, twisted wire pairs, etc.

In the illustrative embodiment, the control circuitry 302 may be in a first stage 316 of the cryogenic refrigerator 300, and the companion chip 308 and the quantum processor 210 may be in a second stage 318 of the cryogenic refrigerator 300. In the illustrative embodiment, the first stage 316 is held at a temperature of about 4 Kelvin, and the second stage 318 is held at a temperature of about 20 millikelvin. In other embodiments, the first stage 316 may be held at, e.g., 1-77 Kelvin, and the second stage 318 may be held at, e.g., 10-100 millikelvin. In some embodiments, the various components of FIG. 3 may be in different stages than that shown in FIG. 3 and/or the refrigerator 300 may include additional stages, such as one or more stages at a higher or lower temperature than the first stage 316 and/or the second stage 318. The cryogenic refrigerator 300 may be any suitable refrigerator with active or passive cooling, such as a dilution refrigerator, a magnetic refrigerator, a helium-4 and/or helium-3 refrigerator, etc.

Figure 4:
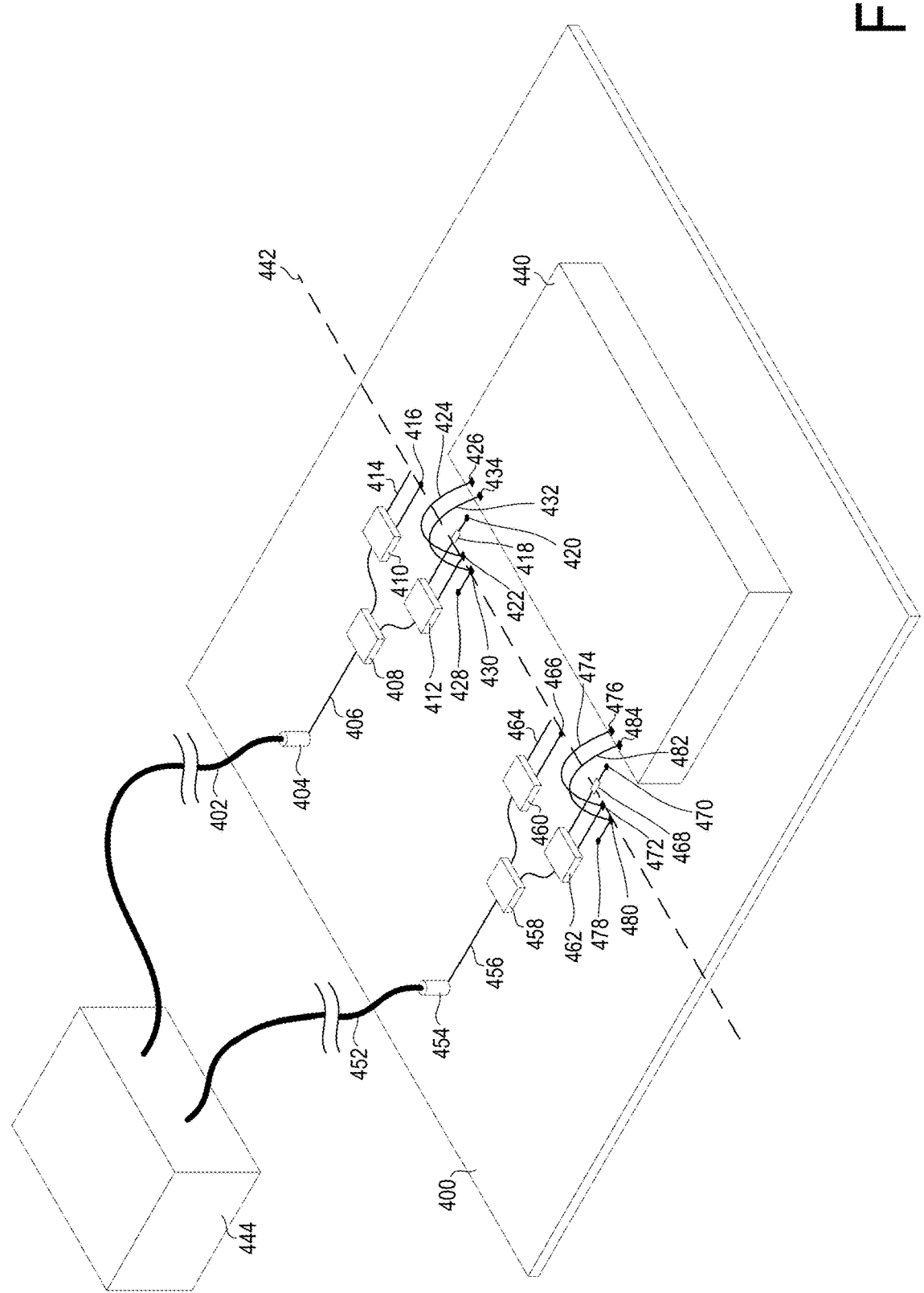
FIG. 4 is an isometric view of one embodiment of a system with a circuit board for de-embedding an integrated circuit component.
Figure 5:
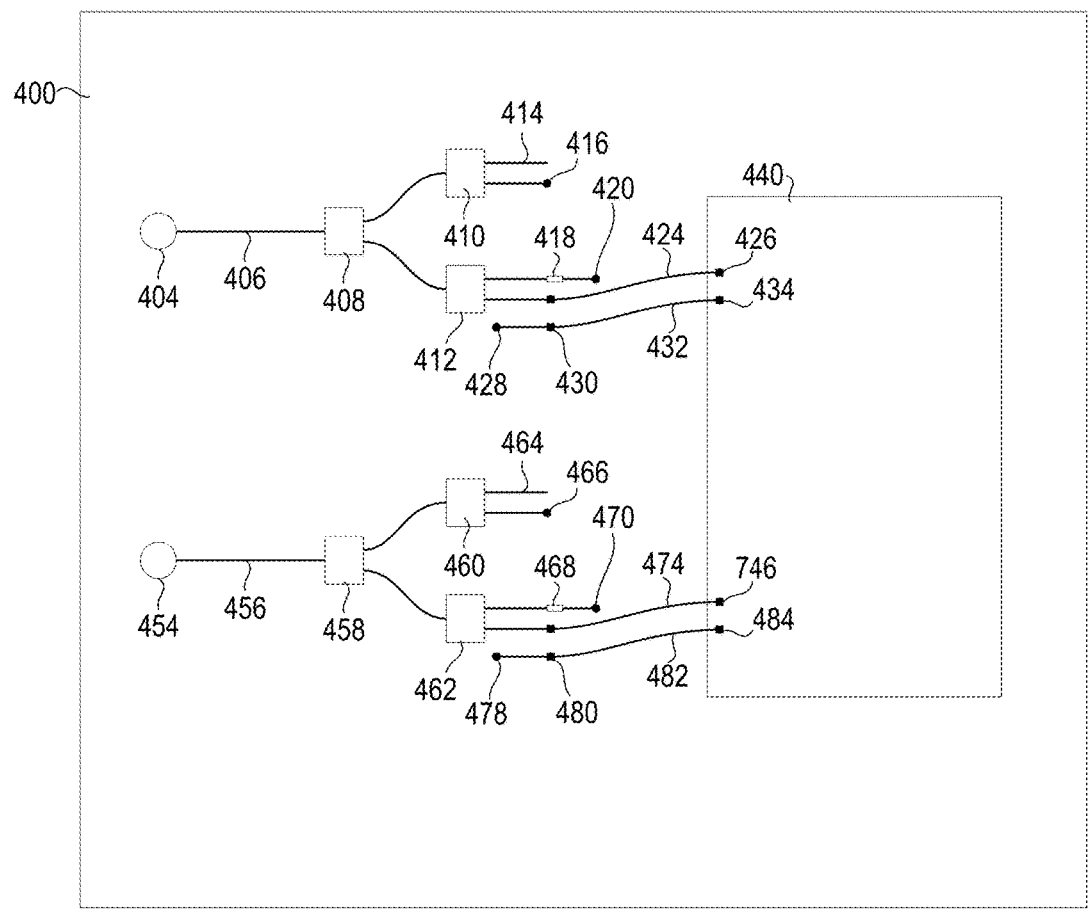
FIG. 5 is a top-down view of the system of FIG. 4.

Referring now to FIGS. 4 and 5, in one embodiment, a circuit board 400 supports an integrated circuit component 440. FIG. 4 shows an isometric view and FIG. 5 shows a top-down view. In the illustrative embodiment, the integrated circuit component 440 acts as a device under test (DUT). In use, in some embodiments, the circuit board 400 and integrated circuit component 440 may be in the second stage 318 of a cryogenic refrigerator 300. The illustrative circuit board 400 may be made from ceramic, glass, and/or organic-based materials with fiberglass and resin, such as FR-4.

A cable 402 with a connector 404 is connected to a connector mounted on the circuit board 400. A trace 406 on the circuit board 400 is connected to one of the wires of the cable 402. The trace 406 is connected to a switch 408. The switch 408 has two outputs, one of which is connected to switch 410, and one of which is connected to switch 412. One output of the switch 410 is connected to a trace 414 that is not connected to anything and acts as an open circuit. Another output of the switch 410 is connected to a via 416, which is connected to ground on another layer of the circuit board 400 (e.g., on the bottom layer). One output of the switch 412 is connected to a load 418 and then to a via 420, which is also connected to ground. The load 418 may be embodied as, e.g., a resistor. The load 418 may match a characteristic impedance of the cable 402 or other transmission line. The load 418 may be, e.g., a 50 Ohm resistor. More generally, the load 418 may have any suitable real or imaginary impedance, such as 10-500 Ohms with any suitable phase. Another output of the switch 412 is connected to a pad 422. A wire bond 424 connects the pad 422 on the circuit board 400 to a pad 426 on the integrated circuit component 440. Another via 428 connected to ground is connected to a pad 430 on the circuit board 400, which is connected by a wire bond 432 to a pad 434 on the integrated circuit component 440.

In use, switches 408, 410, 412 can connect the trace 406 to a short circuit through the via 416, an open circuit through the trace 414, the load 418, or through to the integrated circuit component 440. In the illustrative embodiment, a reference plane 442 is used to define an interface to the DUT 440. The transmission and/or reflection of signals sent through the cable 402 are measured for each of the configurations of the switches 408, 410, 412. The signals may be measured using, e.g., a vector network analyzer 444, with the cable 402 connected to the vector network analyzer 444. In the illustrative embodiment, the vector network analyzer 444 is outside of a cryogenic refrigerator, and one or more cables 402 are used to carry signals between the vector network analyzer 444 and the circuit board 400 and integrated circuit component 440 inside of a cryogenic refrigerator. The measurements can be used to de-embed the DUT 440. Components before the reference plane 442 can be de-embedded, and components after the reference plane 442 may be considered part of the response of the device under test. The de-embedding process may determine scattering parameters (or S-parameters) or similar parameters of the device under test for a one-port network, a two-port network, or a three or more-port network. Any suitable set of measurements and algorithm may be used to perform de-embedding, such as short-open-load-through (SOLT) calibration, short-open-load-reciprocal (SOLR) calibration, through-reflect-load (TRL) calibration, load-reflect-load (LRL) calibration, load-reflect-match (LRM) calibration, etc.

Figure 6:
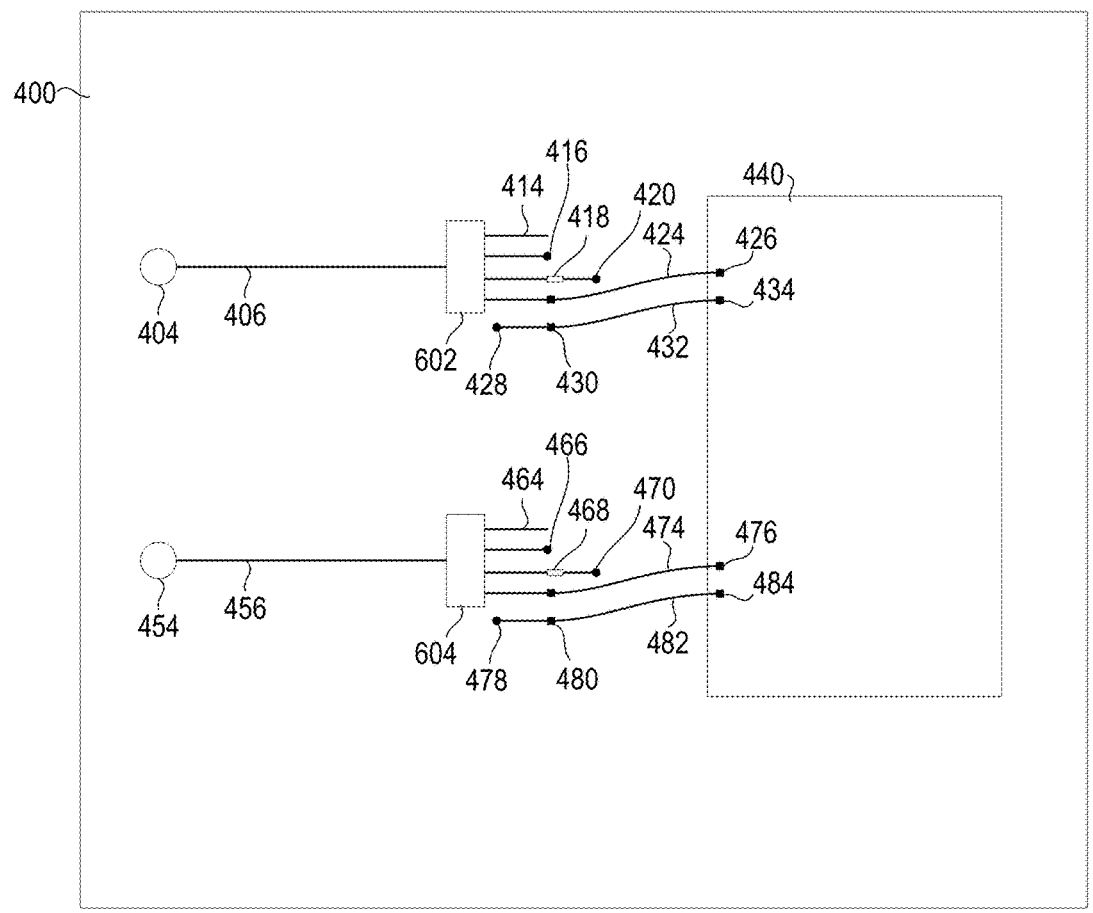
FIG. 6 is a top-down view of one embodiment of a system with a circuit board for de-embedding an integrated circuit component.

The switches 408, 410, 412 may be any suitable type of switches, such as surface mount micromechanical relays. The switches 408, 410, 412 may be single-pole double-throw (SPDT) switches. The switches 408, 410, 412 may be switched in any suitable manner, such as a user toggling a switch, an electromechanical relay, etc. In some embodiments, as shown in FIG. 6, the switches 408, 410, 412 may be replaced by one switch 602, such as a single-pole multi-throw switch that can switch one input to four outputs. In some embodiments, a ground connection may be switched as well as a signal connection.

In the illustrative embodiment, the circuit board 400 includes a ground plane, such as a ground plane on the bottom side of the circuit board 400. In such embodiments, a ground of the cable 402 is connected to the ground plane on the circuit board 400. Additionally or alternatively, in other embodiments, the circuit board 400 may include ground traces, such as ground traces that, together with traces such as traces 406, 414, form coplanar waveguides to carry signals. Such ground traces may be on any suitable layer of the circuit board 400, such as a top layer, a bottom layer, or an intermediate layer.

Figure 7:
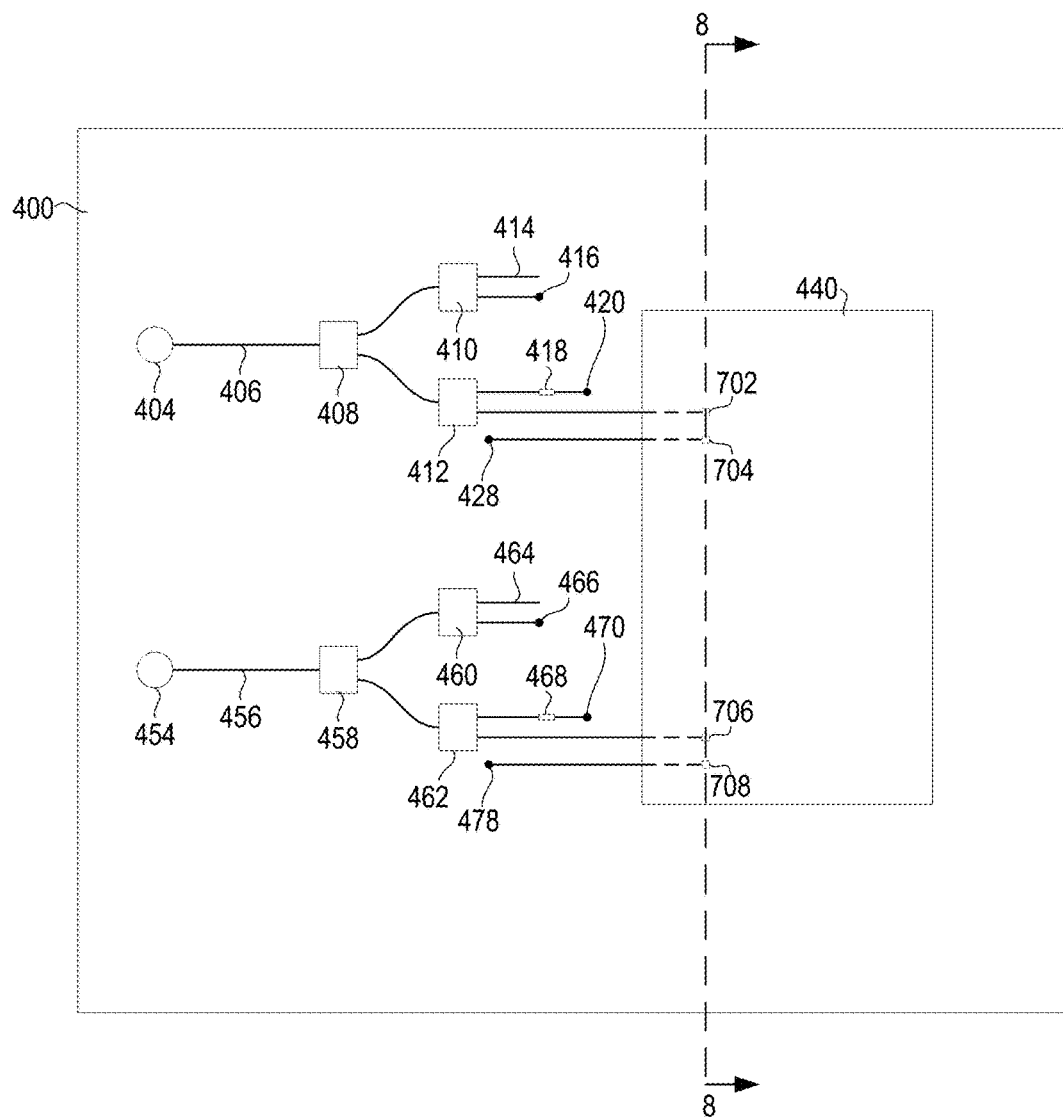
FIG. 7 is a top-down view of one embodiment of a system with a circuit board for de-embedding an integrated circuit component.
Figure 8:
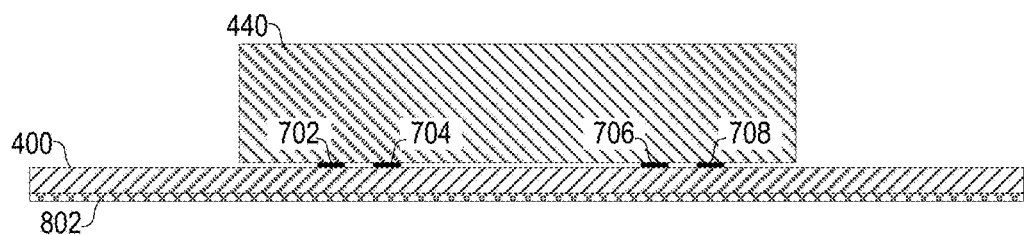
FIG. 8 is a cross-sectional view of the system of FIG. 7.

In the illustrative embodiment, the output of the switch 412 is connected to the integrated circuit component 440 through a wire bond 424. In other embodiments, the output of the switch 412 may be connected to the integrated circuit component 440 in a different manner. For example, the integrated circuit component 440 may be flipped over and mounted to the circuit board 400 through bumps 702, 704, which may be solder bumps 702, 704. FIG. 7 shows a top-down view of such a configuration, and FIG. 8 shows a cross-sectional view of such a configuration. The output of the switch 412 may connect to the integrated circuit component 440 through the bump 702, and a ground may connect to the integrated circuit component 440 through the bump 704. As shown in FIG. 8, a ground plane 802 may be on the bottom side of the circuit board 400.

The integrated circuit component 440 may be embodied as any suitable integrated circuit. The integrated circuit component 440 may include additional pads or other connections, traces, etc., not shown in the figures. The integrated circuit component 440 may include one or more transistors, capacitors, inductors, resistors, etc. In some embodiments, the integrated circuit component 440 may be embodied as control circuitry 302, companion chip 308, or quantum processor 210. In some embodiments, the integrated circuit component 440 may be characterized using the circuit board 400 before being integrated into the quantum compute device 200.

In some embodiments, the integrated circuit component 440 may be de-embedded using a single port de-embedding. In other embodiments, the integrated circuit component 440 may be d-embedding using a two-port de-embedding. In such embodiments, an additional set of components for another port may be included, as shown in FIG. 4. For example, another cable 452 is connected to connector 454, which is connected to a trace 456. Trace 456 is connected to a switch 458. Outputs of the switch 458 are connected to switches 460, 462. An output of switch 460 is connected to an open trace 464. Another output of the switch 460 is connected to a via 466 and then to ground. An output of the switch 462 is connected to a load 468 and then to a via 470, which is connected to ground. Another output of the switch 462 is connected to a pad 472, which is connected by a wire bond 474 to a pad 476 on the integrated circuit component 440. Another via 478 connected to ground is connected to a pad 480, which is connected by a wire bond 482 to a pad 484 on the integrated circuit component 440. In embodiments in which switches 408, 410, 412 are replaced by a switch 602, switches 458, 460, 462 may be replaced by a similar switch 604. In embodiments in which the integrated circuit component 440 is connected to trace 406 through bumps 702, 704, the integrated circuit component 440 may be connected to trace 456 through bumps 706, 708. The various components of the second port such as the trace 456, switches 458, 460, 462, etc., may be similar to the corresponding components of the first port, a description of which may not be repeated in the interest of clarity. In some embodiments, more than two ports may be used for de-embedding.

Figure 9:
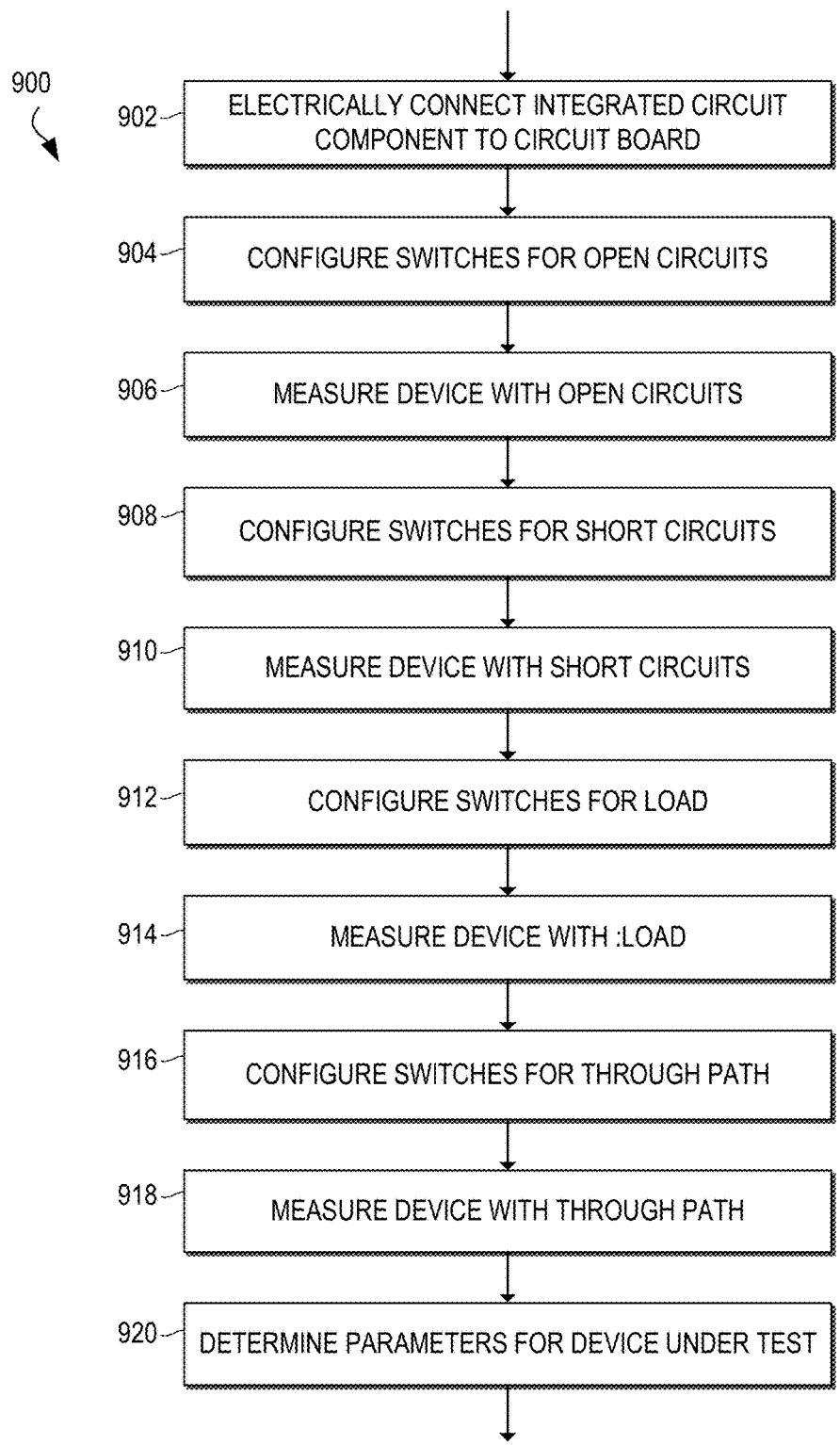
FIG. 9 is a simplified flow diagram of at least one embodiment of a method for de-embedding an integrated circuit component.

Referring now to FIG. 9, in one embodiment, a flowchart for a method 900 for de-embedding a device under test using a circuit board 400 is shown. The method 900 begins in block 902, in which an integrated circuit component 440 is mounted on the circuit board 400. The integrated circuit component 440 may be electrically connected to the circuit board 400 in any suitable manner, such as using wire bonds (e.g., wire bonds 424, 432, 474, 482) or bumps (e.g., bumps 702, 704, 706, 708).

In block 904, switches (such as switches 408, 410, 412, 458, 460, 462, 602, 604) are configured to connect a trace (such as traces 406, 456) to an open circuit (such as trace 414, 464). In block 906, an electrical signal is provided to a trace (such as traces 406 and/or 456), and one or more parameters are measured that result from the electrical signal. For example, an electrical signal may be provided at each of several frequencies at the trace 406, and the reflected and transmitted electrical signals may be measured on the traces 406, 456. The electrical signals may be provided by and the reflected and transmitted signals may be measured by any suitable component, such as vector network analyzer 444. It should be appreciated that, in the illustrative embodiment, the transmitted and reflected signals are measured using the cables 402, 452, and that no probes are used to probe the traces 406, 456 or other components on the circuit board 400 or integrated circuit component 440. Accordingly, such an approach may be used when, e.g., the circuit board 400 and/or integrated circuit component 440 are at different temperatures, pressures, radiation levels, etc., from available probes. In the illustrative embodiment, the electrical signal (and other electrical signals in other steps of the method 900) is provided to the trace while the circuit board 400 and integrated circuit component 440 are inside of a cryogenic refrigerator, such as in the second stage 318 of the cryogenic refrigerator 300. In some embodiments, the integrated circuit component 440 may be part of or designed for use on spacecraft, such as a satellite.

In block 908, switches (such as switches 408, 410, 412, 458, 460, 462, 602, 604) are configured to connect a trace (such as traces 406, 456) to a short circuit (such as through vias 416, 466 connected to ground). In some embodiments, the switches may be toggled manually. In embodiments where the circuit board 400 and integrated circuit component 440 are inside of cryogenic refrigerator during measurements, the circuit board 400 and integrated circuit component 440 may be removed from the cryogenic refrigerator in order to toggle the switches. In other embodiments, the switches may be relays or other switches that can be toggled electronically. In such embodiments, the circuit board 400 and integrated circuit component 440 may remain inside the cryogenic refrigerator between measurements.

In block 910, an electrical signal is provided to a trace (such as traces 406 and/or 456), and one or more parameters are measured that result from the electrical signal. For example, an electrical signal may be provided at each of several frequencies at the trace 406, and the reflected and transmitted electrical signals may be measured on the traces 406, 456.

In block 912, switches (such as switches 408, 410, 412, 458, 460, 462, 602, 604) are configured to connect a trace (such as traces 406, 456) to a load circuit (such as through loads 418, 468). In block 914, an electrical signal is provided to a trace (such as traces 406 and/or 456), and one or more parameters are measured that result from the electrical signal. For example, an electrical signal may be provided at each of several frequencies at the trace 406, and the reflected and transmitted electrical signals may be measured on the traces 406, 456.

In block 916, switches (such as switches 408, 410, 412, 458, 460, 462, 602, 604) are configured to connect a trace (such as traces 406, 456) to a through circuit (such as to the integrated circuit component 440 through the wire bonds 424, 474). In block 918, an electrical signal is provided to a trace (such as traces 406 and/or 456), and one or more parameters are measured that result from the electrical signal. For example, an electrical signal may be provided at each of several frequencies at the trace 406, and the reflected and transmitted electrical signals may be measured on the traces 406, 456.

In block 920, one or more parameters are determined for the device under test, which may be, e.g., the integrated circuit component 440. The one or more parameters may be determined by de-embedding the device under test using the measurements from blocks 906, 910, 914, and 918 using short-open-load-through (SOLT) de-embedding. In other embodiments, different de-embedding techniques may be used using different measurements, such as short-open-load-reciprocal (SOLR) calibration, through-reflect-line (TRL) calibration, line-reflect-line (LRL) calibration, line-reflect-match (LRM) calibration, etc.

Figure 10:
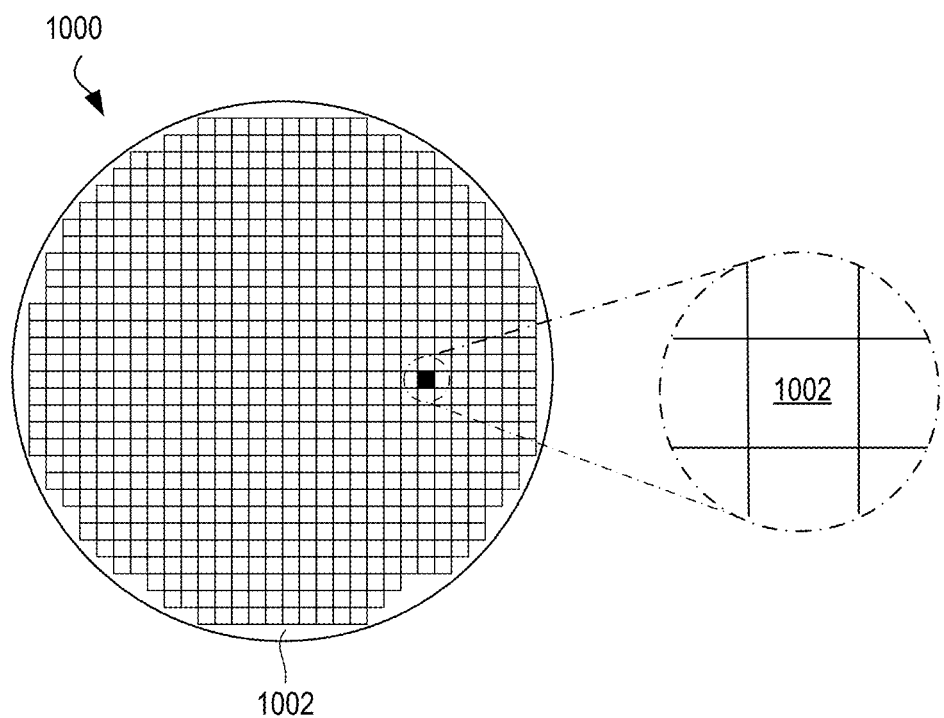
FIG. 10 is a top view of a wafer and dies, in accordance with any of the embodiments disclosed herein.

FIG. 10 is a top view of a wafer 1000 and dies 1002 that may be included in any of the integrated circuit component 440 disclosed herein. The wafer 1000 may be composed of semiconductor material and may include one or more dies 1002 having integrated circuit structures formed on a surface of the wafer 1000. The individual dies 1002 may be a repeating unit of an integrated circuit product that includes any suitable integrated circuit. After the fabrication of the semiconductor product is complete, the wafer 1000 may undergo a singulation process in which the dies 1002 are separated from one another to provide discrete "chips" of the integrated circuit product. The die 1002 may be embodied as or included in any of the integrated circuit components 440 disclosed herein. The die 1002 may include one or more transistors (e.g., some of the transistors 1140 of FIG. 11, discussed below), supporting circuitry to route electrical signals to the transistors, passive components (e.g., signal traces, resistors, capacitors, or inductors), and/or any other integrated circuit components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processor unit (e.g., the processor unit 1402 of FIG. 14) or other logic that is configured to store information in the memory devices or execute instructions stored in the memory array. Various ones of the integrated circuit component 440 disclosed herein may be manufactured using a die-to-wafer assembly technique in which some dies are attached to a wafer 1000 that include others of the dies, and the wafer 1000 is subsequently singulated.

Figure 11:
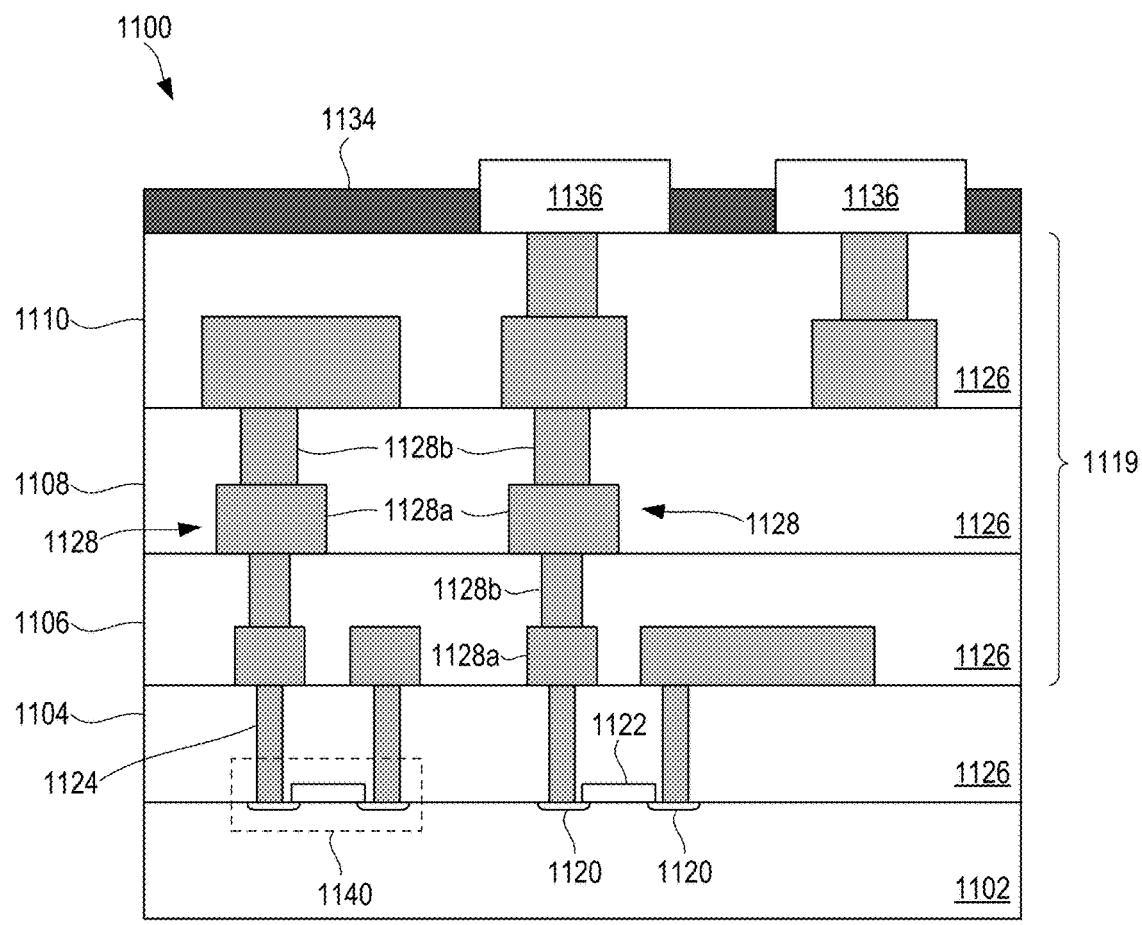
FIG. 11 is a cross-sectional side view of an integrated circuit, in accordance with any of the embodiments disclosed herein.

FIG. 11 is a cross-sectional side view of an integrated circuit device 1100 that may be included in any of the integrated circuit component 440 disclosed herein. One or more of the integrated circuit devices 1100 may be included in one or more dies 1002 (FIG. 10). The integrated circuit device 1100 may be formed on a die substrate 1102 (e.g., the wafer 1000 of FIG. 10) and may be included in a die (e.g., the die 1002 of FIG. 10). The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a silicon-on-insulator (SOI) substructure. In some embodiments, the die substrate 1102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an integrated circuit device 1100 may be used. The die substrate 1102 may be part of a singulated die (e.g., the dies 1002 of FIG. 10) or a wafer (e.g., the wafer 1000 of FIG. 10).

The integrated circuit device 1100 may include one or more device layers 1104 disposed on the die substrate 1102. The device layer 1104 may include features of one or more transistors 1140 (e.g., metal oxide semiconductor field-effect transistors (MOSFETs)) formed on the die substrate 1102. The transistors 1140 may include, for example, one or more source and/or drain (S/D) regions 1120, a gate 1122 to control current flow between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 12A-12D are simplified perspective views of example planar, FinFET, gate-all-around, and stacked gate-all-around transistors. The transistors illustrated in FIGS. 12A-12D are formed on a substrate 1216 having a surface 1208. Isolation regions 1214 separate the source and drain regions of the transistors from other transistors and from a bulk region 1218 of the substrate 1216.

Figure 12B:
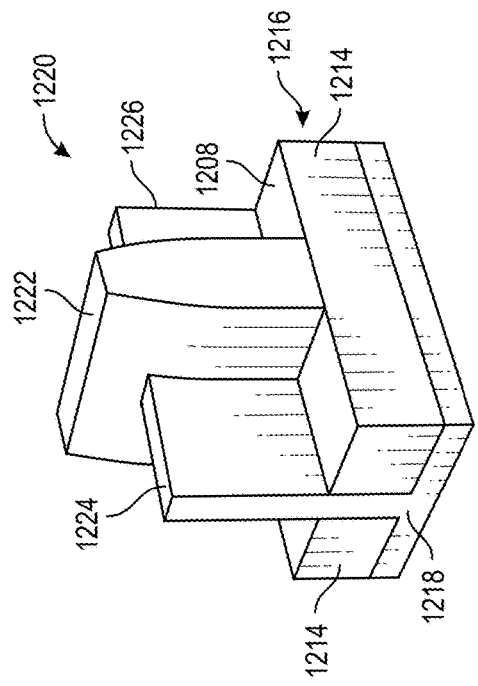
FIGS. 12A-12D are perspective views of example planar, gate-all-around, and stacked gate-all-around transistors.
Figure 12D:
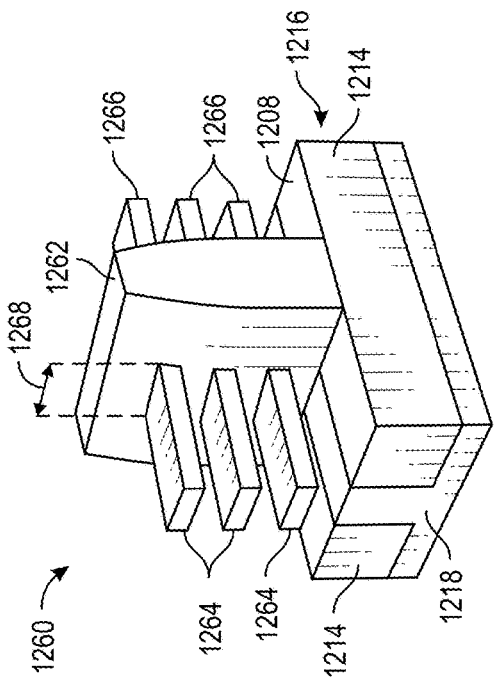
Figure 12A:
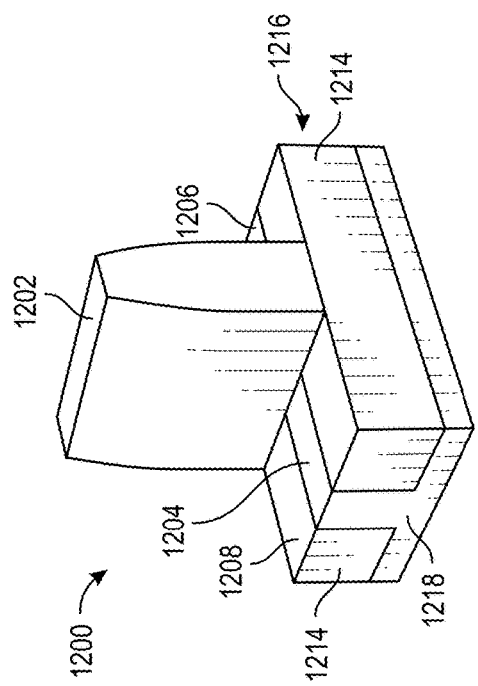

FIG. 12A is a perspective view of an example planar transistor 1200 comprising a gate 1202 that controls current flow between a source region 1204 and a drain region 1206. The transistor 1200 is planar in that the source region 1204 and the drain region 1206 are planar with respect to the substrate surface 1208.

FIG. 12B is a perspective view of an example FinFET transistor 1220 comprising a gate 1222 that controls current flow between a source region 1224 and a drain region 1226. The transistor 1220 is non-planar in that the source region 1224 and the drain region 1226 comprise "fins" that extend upwards from the substrate surface 1228. As the gate 1222 encompasses three sides of the semiconductor fin that extends from the source region 1224 to the drain region 1226, the transistor 1220 can be considered a tri-gate transistor. FIG. 12B illustrates one S/D fin extending through the gate 1222, but multiple S/D fins can extend through the gate of a FinFET transistor.

Figure 12C:
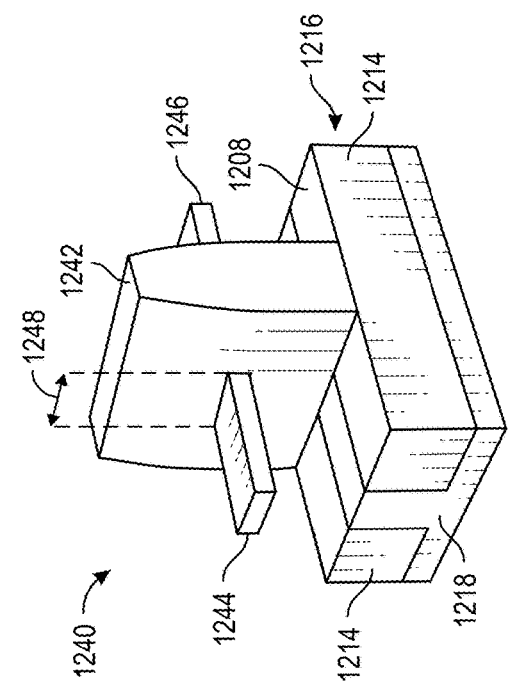

FIG. 12C is a perspective view of a gate-all-around (GAA) transistor 1240 comprising a gate 1242 that controls current flow between a source region 1244 and a drain region 1246. The transistor 1240 is non-planar in that the source region 1244 and the drain region 1246 are elevated from the substrate surface 1228.

FIG. 12D is a perspective view of a GAA transistor 1260 comprising a gate 1262 that controls current flow between multiple elevated source regions 1264 and multiple elevated drain regions 1266. The transistor 1260 is a stacked GAA transistor as the gate controls the flow of current between multiple elevated S/D regions stacked on top of each other. The transistors 1240 and 1260 are considered gate-all-around transistors as the gates encompass all sides of the semiconductor portions that extends from the source regions to the drain regions. The transistors 1240 and 1260 can alternatively be referred to as nanowire, nanosheet, or nanoribbon transistors depending on the width (e.g., widths 1248 and 1268 of transistors 1240 and 1260, respectively) of the semiconductor portions extending through the gate.

Returning to FIG. 11, a transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the die substrate 1102 and two sidewall portions that are substantially perpendicular to the top surface of the die substrate 1102. In other embodiments, at least one of the metal layers that form the gate electrode may simply be a planar layer that is substantially parallel to the top surface of the die substrate 1102 and does not include sidewall portions substantially perpendicular to the top surface of the die substrate 1102. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of individual transistors 1140. The S/D regions 1120 may be formed using an implantation/diffusion process or an etching/deposition process, for example. In the former process, dopants such as boron, aluminum, antimony, phosphorous, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the integrated circuit device 1100.

The interconnect structures 1128 may be arranged within the interconnect layers 1106-1110 to route electrical signals according to a wide variety of designs; in particular, the arrangement is not limited to the particular configuration of interconnect structures 1128 depicted in FIG. 11. Although a particular number of interconnect layers 1106-1110 is depicted in FIG. 11, embodiments of the present disclosure include integrated circuit devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the die substrate 1102 upon which the device layer 1104 is formed. For example, the lines 1128a may route electrical signals in a direction in and out of the page and/or in a direction across the page. The vias 1128b may be arranged to route electrical signals in a direction of a plane that is substantially perpendicular to the surface of the die substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 11. In some embodiments, dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same. The device layer 1104 may include a dielectric material 1126 disposed between the transistors 1140 and a bottom layer of the metallization stack as well. The dielectric material 1126 included in the device layer 1104 may have a different composition than the dielectric material 1126 included in the interconnect layers 1106-1110; in other embodiments, the composition of the dielectric material 1126 in the device layer 1104 may be the same as a dielectric material 1126 included in any one of the interconnect layers 1106-1110.

A first interconnect layer 1106 (referred to as Metal 1 or "M1") may be formed directly on the device layer 1104. In some embodiments, the first interconnect layer 1106 may include lines 1128*a* and/or vias 1128*b*, as shown. The lines 1128*a* of the first interconnect layer 1106 may be coupled with contacts (e.g., the S/D contacts 1124) of the device layer 1104. The vias 1128*b* of the first interconnect layer 1106 may be coupled with the lines 1128*a* of a second interconnect layer 1108.

The second interconnect layer 1108 (referred to as Metal 2 or "M2") may be formed directly on the first interconnect layer 1106. In some embodiments, the second interconnect layer 1108 may include via 1128*b* to couple the lines 1128 of the second interconnect layer 1108 with the lines 1128*a* of a third interconnect layer 1110. Although the lines 1128*a* and the vias 1128*b* are structurally delineated with a line within individual interconnect layers for the sake of clarity, the lines 1128*a* and the vias 1128*b* may be structurally and/or materially contiguous (e.g., simultaneously filled during a dual-damascene process) in some embodiments.

The third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the integrated circuit device 1100 (i.e., farther away from the device layer 1104) may be thicker that the interconnect layers that are lower in the metallization stack 1119, with lines 1128*a* and vias 1128*b* in the higher interconnect layers being thicker than those in the lower interconnect layers.

The integrated circuit device 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to external devices. For example, solder bonds may be formed on the one or more conductive contacts 1136 to mechanically and/or electrically couple an integrated circuit die including the integrated circuit device 1100 with another component (e.g., a printed circuit board). The integrated circuit device 1100 may include additional or alternate structures to route the electrical signals from the interconnect layers 1106-1110; for example, the conductive contacts 1136 may include other analogous features (e.g., posts) that route the electrical signals to external components.

In some embodiments in which the integrated circuit device 1100 is a double-sided die, the integrated circuit device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the integrated circuit device 1100 from the conductive contacts 1136.

In other embodiments in which the integrated circuit device 1100 is a double-sided die, the integrated circuit device 1100 may include one or more through silicon vias (TSVs) through the die substrate 1102; these TSVs may make contact with the device layer(s) 1104, and may provide conductive pathways between the device layer(s) 1104 and additional conductive contacts (not shown) on the opposite side of the integrated circuit device 1100 from the conductive contacts 1136. In some embodiments, TSVs extending through the substrate can be used for routing power and ground signals from conductive contacts on the opposite side of the integrated circuit device 1100 from the conductive contacts 1136 to the transistors 1140 and any other components integrated into the die 1100, and the metallization stack 1119 can be used to route I/O signals from the conductive contacts 1136 to transistors 1140 and any other components integrated into the die 1100.

Multiple integrated circuit devices 1100 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 13:
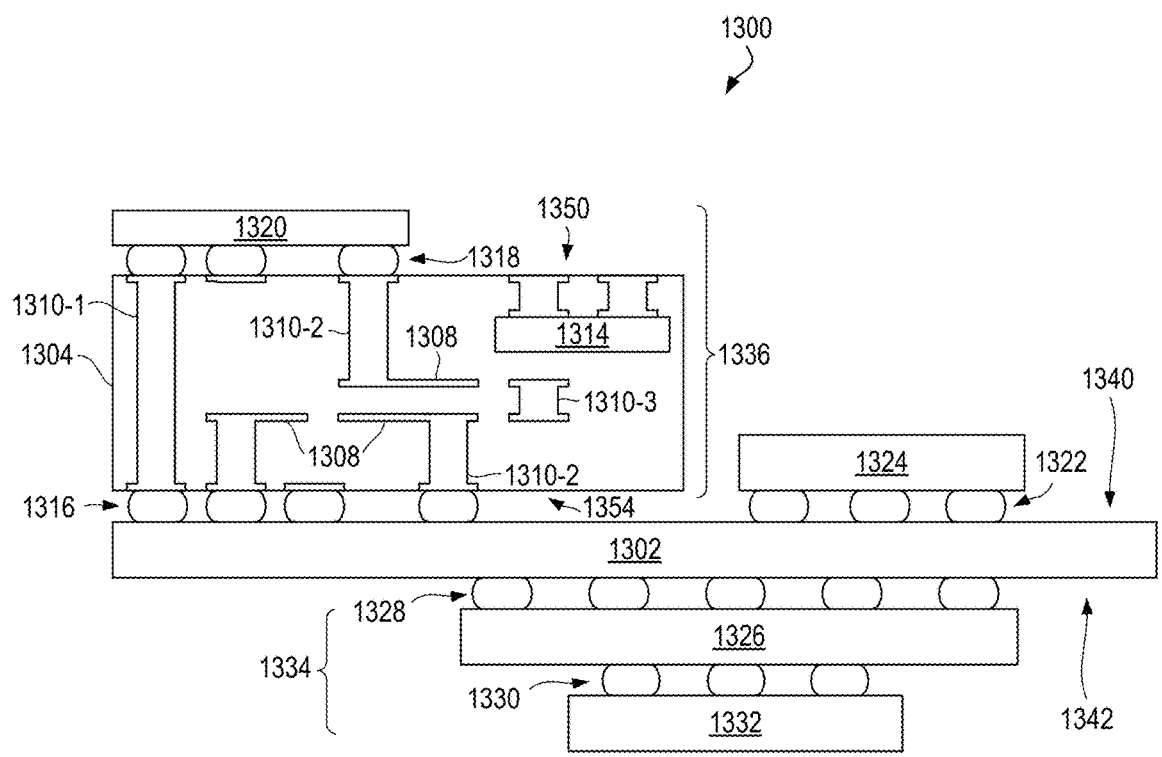
FIG. 13 is a cross-sectional side view of an integrated circuit device assembly, in accordance with any of the embodiments disclosed herein.

FIG. 13 is a cross-sectional side view of an integrated circuit device assembly 1300 that may be embodied as or includes in any of the integrated circuit components 440 disclosed herein. The integrated circuit device assembly 1300 includes a number of components disposed on a circuit board 1302 (which may be a motherboard, system board, mainboard, etc.). The integrated circuit device assembly 1300 includes components disposed on a first face 1340 of the circuit board 1302 and an opposing second face 1342 of the circuit board 1302; generally, components may be disposed on one or both faces 1340 and 1342. Any of the integrated circuit components discussed below with reference to the integrated circuit device assembly 1300 may take the form of any suitable ones of the embodiments of the integrated circuit components 440 disclosed herein.

In some embodiments, the circuit board 1302 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate. In some embodiments the circuit board 1302 may be, for example, the circuit board 400. The integrated circuit device assembly 1300 illustrated in FIG. 13 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 13), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1336 may include an integrated circuit component 1320 coupled to an interposer 1304 by coupling components 1318. The coupling components 1318 may take any suitable form for the application, such as the forms discussed above with reference to the coupling components 1316. Although a single integrated circuit component 1320 is shown in FIG. 13, multiple integrated circuit components may be coupled to the interposer 1304; indeed, additional interposers may be coupled to the interposer 1304. The interposer 1304 may provide an intervening substrate used to bridge the circuit board 1302 and the integrated circuit component 1320.

The integrated circuit component 1320 may be a packaged or unpacked integrated circuit product that includes one or more integrated circuit dies (e.g., the die 1002 of FIG. 10, the integrated circuit device 1100 of FIG. 11) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1320, a single monolithic integrated circuit die comprises solder bumps attached to contacts on the die. The solder bumps allow the die to be directly attached to the interposer 1304. The integrated circuit component 1320 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1320 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1320 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1320 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1304 may spread connections to a wider pitch or reroute a connection to a different connection. For example, the interposer 1304 may couple the integrated circuit component 1320 to a set of ball grid array (BGA) conductive contacts of the coupling components 1316 for coupling to the circuit board 1302. In the embodiment illustrated in FIG. 13, the integrated circuit component 1320 and the circuit board 1302 are attached to opposing sides of the interposer 1304; in other embodiments, the integrated circuit component 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through hole vias 1310-1 (that extend from a first face 1350 of the interposer 1304 to a second face 1354 of the interposer 1304), blind vias 1310-2 (that extend from the first or second faces 1350 or 1354 of the interposer 1304 to an internal metal layer), and buried vias 1310-3 (that connect internal metal layers).

In some embodiments, the interposer 1304 can comprise a silicon interposer. Through silicon vias (TSV) extending through the silicon interposer can connect connections on a first face of a silicon interposer to an opposing second face of the silicon interposer. In some embodiments, an interposer 1304 comprising a silicon interposer can further comprise one or more routing layers to route connections on a first face of the interposer 1304 to an opposing second face of the interposer 1304.

The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art. In embodiments where the interposer is a non-printed circuit board The integrated circuit device assembly 1300 may include an integrated circuit component 1324 coupled to the first face 1340 of the circuit board 1302 by coupling components 1322. The coupling components 1322 may take the form of any of the embodiments discussed above with reference to the coupling components 1316, and the integrated circuit component 1324 may take the form of any of the embodiments discussed above with reference to the integrated circuit component 1320.

The integrated circuit device assembly 1300 illustrated in FIG. 13 includes a package-on-package structure 1334 coupled to the second face 1342 of the circuit board 1302 by coupling components 1328. The package-on-package structure 1334 may include an integrated circuit component 1326 and an integrated circuit component 1332 coupled together by coupling components 1330 such that the integrated circuit component 1326 is disposed between the circuit board 1302 and the integrated circuit component 1332. The coupling components 1328 and 1330 may take the form of any of the embodiments of the coupling components 1316 discussed above, and the integrated circuit components 1326 and 1332 may take the form of any of the embodiments of the integrated circuit component 1320 discussed above. The package-on-package structure 1334 may be configured in accordance with any of the package-on-package structures known in the art.

Figure 14:
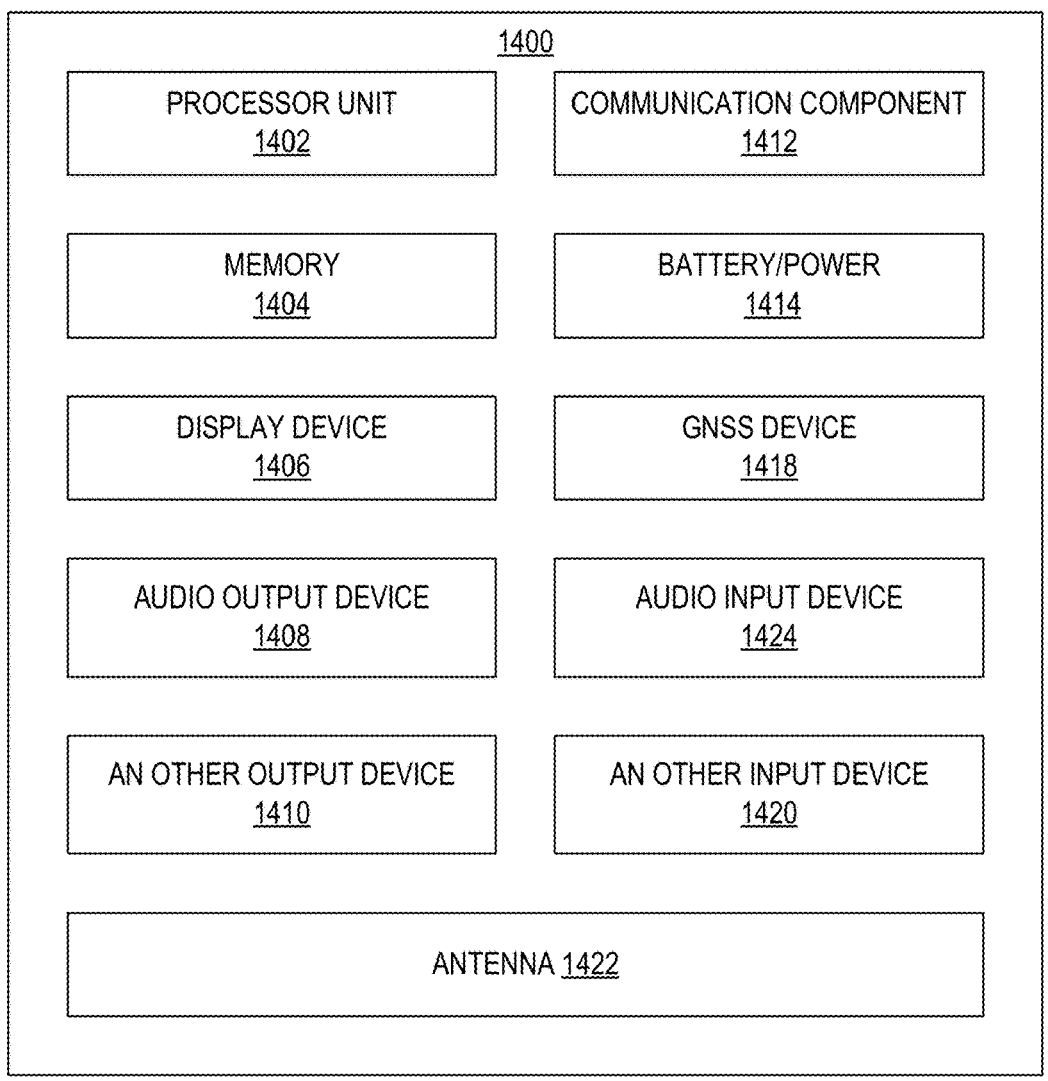
FIG. 14 is a block diagram of an example electrical device, in accordance with any of the embodiments disclosed herein.

FIG. 14 is a block diagram of an example electrical device 1400 that may include one or more of the integrated circuit components 440 disclosed herein. For example, any suitable ones of the components of the electrical device 1400 may include one or more of the integrated circuit device assemblies 1300, integrated circuit components 1320, integrated circuit devices 1100, or integrated circuit dies 1002 disclosed herein, and may be arranged in any of the integrated circuit components 440 disclosed herein. A number of components are illustrated in FIG. 14 as included in the electrical device 1400, but any one or more of these components may be omitted or duplicated, as suitable for the application. In some embodiments, some or all of the components included in the electrical device 1400 may be attached to one or more motherboards mainboards, or system boards. In some embodiments, one or more of these components are fabricated onto a single system-on-a-chip (SoC) die.

Additionally, in various embodiments, the electrical device 1400 may not include one or more of the components illustrated in FIG. 14, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include one or more processor units 1402 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1402 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1400 may include a memory 1404, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1404 may include memory that is located on the same integrated circuit die as the processor unit 1402. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1400 can comprise one or more processor units 1402 that are heterogeneous or asymmetric to another processor unit 1402 in the electrical device 1400. There can be a variety of differences between the processing units 1402 in a system in terms of a spectrum of metrics of merit including architectural, microarchitectural, thermal, power consumption characteristics, and the like. These differences can effectively manifest themselves as asymmetry and heterogeneity among the processor units 1402 in the electrical device 1400.

In some embodiments, the electrical device 1400 may include a communication component 1412 (e.g., one or more communication components). For example, the communication component 1412 can manage wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication component 1412 may manage wired communications, such as electrical, optical, or any other suitable communication protocols (e.g., IEEE 802.3 Ethernet standards). As noted above, the communication component 1412 may include multiple communication components. For instance, a first communication component 1412 may be dedicated to shorter-range wireless communications such as Wi-Fi or Bluetooth, and a second communication component 1412 may be dedicated to longer-range wireless communications such as global positioning system (GPS), EDGE, GPRS, CDMA, WiMAX, LTE, EV-DO, or others. In some embodiments, a first communication component 1412 may be dedicated to wireless communications, and a second communication component 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any embedded or wired or wirelessly connected external device that generates an audible indicator, such speakers, headsets, or earbuds.

The electrical device 1400 may include an audio input device 1424 (or corresponding interface circuitry, as discussed above). The audio input device 1424 may include any embedded or wired or wirelessly connected device that generates a signal representative of a sound, such as microphones, microphone arrays, or digital instruments (e.g., instruments having a musical instrument digital interface (MIDI) output). The electrical device 1400 may include a Global Navigation Satellite System (GNSS) device 1418 (or corresponding interface circuitry, as discussed above), such as a Global Positioning System (GPS) device. The GNSS device 1418 may be in communication with a satellite-based system and may determine a geolocation of the electrical device 1400 based on information received from one or more GNSS satellites, as known in the art.

The electrical device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include an other input device 1420 (or corresponding interface circuitry, as discussed above). Examples of the other input device 1420 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1400 may be any other electronic device that processes data. In some embodiments, the electrical device 1400 may comprise multiple discrete physical components. Given the range of devices that the electrical device 1400 can be manifested as in various embodiments, in some embodiments, the electrical device 1400 can be referred to as a computing device or a computing system.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

Examples

Illustrative examples of the technologies disclosed herein are provided below. An embodiment of the technologies may include any one or more, and any combination of, the examples described below.

Example 1 includes a system comprising a circuit board comprising a connector to mate with a cable; a trace connected to the connector; and one or more micromechanical switches to switch the trace between (i) a short circuit, (ii) an open circuit, (iii) a load circuit, and (iv) a through circuit.

Example 2 includes the subject matter of Example 1, and further including an integrated circuit component mated with the circuit board, wherein the one or more micromechanical switches are configurable to switch the trace to the integrated circuit component.

Example 3 includes the subject matter of any of Examples 1 and 2, and further including a plurality of wire bonds, wherein individual wire bonds of the plurality of wire bonds connect a pad on the circuit board to a pad on the integrated circuit component.

Example 4 includes the subject matter of any of Examples 1-3, and wherein the integrated circuit component is mounted on the circuit board using one or more solder bumps, wherein the one or more micromechanical switches are configurable to switch the trace to one of the one or more solder bumps.

Example 5 includes the subject matter of any of Examples 1-4, and further including a vector network analyzer connected to the cable, wherein the vector network analyzer is to send one or more electrical signals to the cable and measure a transmitted and reflected signal.

Example 6 includes the subject matter of any of Examples 1-5, and wherein individual micromechanical switches of the one or more micromechanical switches are single-pole double-throw switches.

Example 7 includes the subject matter of any of Examples 1-6, and wherein individual micromechanical switches of the one or more micromechanical switches are electrically-controlled relays.

Example 8 includes the subject matter of any of Examples 1-7, and wherein individual micromechanical switches of the one or more micromechanical switches are manually-toggled switches.

Example 9 includes the subject matter of any of Examples 1-8, and wherein the one or more micromechanical switches comprise a single-pole multi-throw switch with four outputs.

Example 10 includes the subject matter of any of Examples 1-9, and wherein the one or more micromechanical switches are to switch the trace between (i) the short circuit, (ii) the open circuit, (iii) the load circuit, and (iv) the through circuit in a cryogenic refrigerator at a temperature below 20 Kelvin.

Example 11 includes a method comprising configuring one or more switches on a circuit board to a plurality of configurations, wherein individual configurations of the plurality of configurations connect a trace on the circuit board to different individual components of a plurality of components; providing, for individual configurations of the plurality of configurations, an electrical signal to the trace; measuring, for individual configurations of the plurality of configurations, one or more parameters that result from the provided electrical signal; and de-embedding an integrated circuit component electrically connected to the circuit board based on the one or more parameters for individual configurations of the plurality of configurations.

Example 12 includes the subject matter of Example 11, and wherein the plurality of components comprises an open circuit, a short circuit, a load circuit, and a through circuit, wherein the through circuit comprises at least part of the integrated circuit component.

Example 13 includes the subject matter of any of Examples 11 and 12, and wherein de-embedding the integrated circuit component comprises determining two-port scattering parameters of the integrated circuit component.

Example 14 includes the subject matter of any of Examples 11-13, and wherein de-embedding the integrated circuit component comprises de-embedding the integrated circuit component without using measurements of a probe on a trace of the circuit board.

Example 15 includes the subject matter of any of Examples 11-14, and wherein measuring, for individual configurations of the plurality of configurations, the one or more parameters that result from the provided electrical signal comprises measuring, for individual configurations of the plurality of configurations, the one or more parameters that result from the provided electrical signal while the circuit board and the integrated circuit component are inside of a cryogenic refrigerator and are at a temperature less than 20 Kelvin.

Example 16 includes the subject matter of any of Examples 11-15, and wherein individual wire bonds of a plurality of wire bonds connect a pad on the circuit board to a pad on the integrated circuit component.

Example 17 includes the subject matter of any of Examples 11-16, and wherein the integrated circuit component is mounted on the circuit board using one or more solder bumps, wherein the one or more switches are configurable to switch the trace to one of the one or more solder bumps.

Example 18 includes the subject matter of any of Examples 11-17, and further including connecting a cable to a vector network analyzer and to a connector on the circuit board, wherein the trace is connected to the connector, wherein providing, for individual configurations of the plurality of configurations, the electrical signal to the trace comprises providing, for individual configurations of the plurality of configurations and by the vector network analyzer, the electrical signal to the trace, wherein measuring, for individual configurations of the plurality of configurations, the one or more parameters comprises measuring, for individual configurations of the plurality of configurations, the one or more parameters by the vector network analyzer.

Example 19 includes the subject matter of any of Examples 11-18, and wherein individual switches of the one or more switches are micromechanical switches.

Example 20 includes the subject matter of any of Examples 11-19, and wherein individual switches of the one or more switches are single-pole double-throw switches.

Example 21 includes the subject matter of any of Examples 11-20, and wherein individual switches of the one or more switches are electrically-controlled relays.

Example 22 includes the subject matter of any of Examples 11-21, and wherein individual switches of the one or more switches are manually-toggled switches.

Example 23 includes the subject matter of any of Examples 11-22, and wherein the one or more switches comprise a single-pole multi-throw switch with four outputs.

Example 24 includes a system comprising a circuit board; an integrated circuit component; and means for determining parameters for de-embedding the integrated circuit component.

Example 25 includes the subject matter of Example 24, and wherein the means for determining the parameters for de-embedding the integrated circuit component comprises one or more micromechanical switches to switch a trace of the circuit board between (i) a short circuit, (ii) an open circuit, (iii) a load circuit, and (iv) a through circuit.

Example 26 includes the subject matter of any of Examples 24 and 25, and wherein the means for determining parameters for de-embedding the integrated circuit component comprises means for determining parameters for de-embedding the integrated circuit component without using a probe connected to a trace on the circuit board.

Example 27 includes the subject matter of any of Examples 24-26, and further including a plurality of wire bonds, wherein individual wire bonds of the plurality of wire bonds connect a pad on the circuit board to a pad on the integrated circuit component.

Example 28 includes the subject matter of any of Examples 24-27, and wherein the integrated circuit component is mounted on the circuit board using one or more solder bumps, wherein the one or more micromechanical switches are configurable to switch a trace of the circuit board to one of the one or more solder bumps.

Example 29 includes the subject matter of any of Examples 24-28, and wherein the means for determining the parameters for de-embedding the integrated circuit component comprising a vector network analyzer connected to a cable, wherein the cable is connected to a connector on the circuit board, wherein the vector network analyzer is to send one or more electrical signals to the cable and measure a transmitted and reflected signal.

Example 30 includes the subject matter of any of Examples 24-29, and wherein the means for determining the parameters for de-embedding the integrated circuit component comprise one or more micromechanical switches.

Example 31 includes the subject matter of any of Examples 24-30, and wherein the one or more micromechanical switches are configurable to switch a trace of the circuit board to the integrated circuit component.

Example 32 includes the subject matter of any of Examples 24-31, and wherein individual micromechanical switches of the one or more micromechanical switches are single-pole double-throw switches.

Example 33 includes the subject matter of any of Examples 24-32, and wherein individual micromechanical switches of the one or more micromechanical switches are electrically-controlled relays.

Example 34 includes the subject matter of any of Examples 24-33, and wherein individual micromechanical switches of the one or more micromechanical switches are manually-toggled switches.

Example 35 includes the subject matter of any of Examples 24-34, and wherein the one or more micromechanical switches comprise a single-pole multi-throw switch with four outputs.

Example 36 includes the subject matter of any of Examples 24-35, and wherein the one or more micromechanical switches are to switch a trace of the circuit board between (i) a short circuit, (ii) an open circuit, (iii) a load circuit, and (iv) a through circuit in a cryogenic refrigerator at a temperature below 20 Kelvin.

The invention claimed is:

1. A system comprising:
a circuit board comprising:
a connector to mate with a cable;
a trace connected to the connector; and
one or more micromechanical switches to switch the trace between (i) a short circuit, (ii) an open circuit, (iii) a load circuit, and (iv) a through circuit.

2. The system of claim 1, further comprising an integrated circuit component mated with the circuit board, wherein the one or more micromechanical switches are configurable to switch the trace to the integrated circuit component.

3. The system of claim 2, further comprising a plurality of wire bonds, wherein individual wire bonds of the plurality of wire bonds connect a pad on the circuit board to a pad on the integrated circuit component.

4. The system of claim 2, wherein the integrated circuit component is mounted on the circuit board using one or more solder bumps, wherein the one or more micromechanical switches are configurable to switch the trace to one of the one or more solder bumps.

5. The system of claim 1, further comprising a vector network analyzer connected to the cable, wherein the vector network analyzer is to send one or more electrical signals to the cable and measure a transmitted and reflected signal.

6. The system of claim 1, wherein individual micromechanical switches of the one or more micromechanical switches are single-pole double-throw switches.

7. The system of claim 1, wherein individual micromechanical switches of the one or more micromechanical switches are electrically-controlled relays.

8. The system of claim 1, wherein individual micromechanical switches of the one or more micromechanical switches are manually-toggled switches.

9. The system of claim 1, wherein the one or more micromechanical switches comprise a single-pole multi-throw switch with four outputs.

10. The system of claim 1, wherein the one or more micromechanical switches are to switch the trace between (i) the short circuit, (ii) the open circuit, (iii) the load circuit, and (iv) the through circuit in a cryogenic refrigerator at a temperature below 20 Kelvin.

11. A method comprising:
configuring one or more switches on a circuit board to a plurality of configurations, wherein individual configurations of the plurality of configurations connect a trace on the circuit board to different individual components of a plurality of components, wherein configuring the one or more switches comprises switching the trace between (i) a short circuit, (ii) an open circuit, (iii) a load circuit, and (iv) a through circuit;
providing, for individual configurations of the plurality of configurations, an electrical signal to the trace;
measuring, for individual configurations of the plurality of configurations, one or more parameters that result from the provided electrical signal; and
de-embedding an integrated circuit component electrically connected to the circuit board based on the one or more parameters for individual configurations of the plurality of configurations.

12. The method of claim 11, wherein the plurality of components comprises an open circuit, a short circuit, a load circuit, and a through circuit, wherein the through circuit comprises at least part of the integrated circuit component.

13. The method of claim 11, wherein de-embedding the integrated circuit component comprises determining two-port scattering parameters of the integrated circuit component.

14. The method of claim 11, wherein de-embedding the integrated circuit component comprises de-embedding the integrated circuit component without using measurements of a probe on a trace of the circuit board.

15. The method of claim 11, wherein measuring, for individual configurations of the plurality of configurations, the one or more parameters that result from the provided electrical signal comprises measuring, for individual configurations of the plurality of configurations, the one or more parameters that result from the provided electrical signal while the circuit board and the integrated circuit component are inside of a cryogenic refrigerator and are at a temperature less than 20 Kelvin.

16. The method of claim 11, further comprising connecting a cable to a vector network analyzer and to a connector on the circuit board, wherein the trace is connected to the connector,
wherein providing, for individual configurations of the plurality of configurations, the electrical signal to the trace comprises providing, for individual configurations of the plurality of configurations and by the vector network analyzer, the electrical signal to the trace,
wherein measuring, for individual configurations of the plurality of configurations, the one or more parameters comprises measuring, for individual configurations of the plurality of configurations, the one or more parameters by the vector network analyzer.

17. The method of claim 11, wherein individual switches of the one or more switches are micromechanical switches.

18. A system comprising:
a circuit board;
an integrated circuit component; and
means for determining parameters for de-embedding the integrated circuit component.

19. The system of claim 18, wherein the means for determining the parameters for de-embedding the integrated circuit component comprises one or more micromechanical switches to switch a trace of the circuit board between (i) a short circuit, (ii) an open circuit, (iii) a load circuit, and (iv) a through circuit.

20. The system of claim 18, wherein the means for determining parameters for de-embedding the integrated circuit component comprises means for determining parameters for de-embedding the integrated circuit component without using a probe connected to a trace on the circuit board.

21. The system of claim 18, further comprising a plurality of wire bonds, wherein individual wire bonds of the plurality of wire bonds connect a pad on the circuit board to a pad on the integrated circuit component.

22. The system of claim 18, wherein the means for determining the parameters for de-embedding the integrated circuit component comprising a vector network analyzer connected to a cable, wherein the cable is connected to a connector on the circuit board, wherein the vector network analyzer is to send one or more electrical signals to the cable and measure a transmitted and reflected signal.

23. The system of claim 18, wherein the means for determining the parameters for de-embedding the integrated circuit component comprise one or more micromechanical switches.

24. The system of claim 23, wherein the one or more micromechanical switches are configurable to switch a trace of the circuit board to the integrated circuit component.

25. The system of claim 23, wherein the one or more micromechanical switches are to switch a trace of the circuit board between (i) a short circuit, (ii) an open circuit, (iii) a load circuit, and (iv) a through circuit in a cryogenic refrigerator at a temperature below 20 Kelvin.

\* \* \* \* \*